US012701855B2

(12) United States Patent
Jung et al.

(10) Patent No.: US 12,701,855 B2
(45) Date of Patent: Aug. 4, 2026

(54) DISPLAY DEVICE

(71) Applicant: Samsung Display Co., Ltd., Yongin-si (KR)

(72) Inventors: Jin-Soo Jung, Hwaseong-si (KR); Kyu Hwan Hwang, Seongnam-si (KR); Kwang Soo Bae, Yongin-si (KR); Seokgyu Yoon, Hwaseong-si (KR); Dae-Young Lee, Seoul (KR); Duckjung Lee, Hwaseong-si (KR); Da-Hee Jeong, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 731 days.

(21) Appl. No.: 18/087,947

(22) Filed: Dec. 23, 2022

(65) Prior Publication Data

US 2023/0232690 A1　Jul. 20, 2023

(30) Foreign Application Priority Data

Jan. 18, 2022　(KR) ........................ 10-2022-0007420

(51) Int. Cl.
| | |
|---|---|
| *H10K 59/35* | (2023.01) |
| *H10K 39/34* | (2023.01) |
| *H10K 59/40* | (2023.01) |

(52) U.S. Cl.
CPC ........... *H10K 39/34* (2023.02); *H10K 59/352* (2023.02); *H10K 59/353* (2023.02); *H10K 59/40* (2023.02)

(58) Field of Classification Search
CPC ........ H10K 39/32; H10K 39/34; H10K 59/65; H10K 59/876; H10K 50/852
See application file for complete search history.

(56) References Cited

U.S. PATENT DOCUMENTS

| | | | |
|---|---|---|---|
| 10,176,355 B2 | 1/2019 | Smith et al. | |
| 10,908,445 B2 | 2/2021 | Liu et al. | |
| | (Continued) | | |

FOREIGN PATENT DOCUMENTS

| | | |
|---|---|---|
| EP | 3 439 043 | 2/2019 |
| EP | 3 930 001 | 12/2021 |
| | (Continued) | |

OTHER PUBLICATIONS

Korean Intellectual Property Office, Request for the Submission of an Opinion, Korean Application No. 10-2022-0007420, Mar. 3, 2026, all pages. (Year: 2026).*

*Primary Examiner* — Victoria K. Hall
(74) *Attorney, Agent, or Firm* — Womble Bond Dickinson (US) LLP

(57) ABSTRACT

A display device includes first and second unit pixels adjacent to each other in a first direction. Each of the first and second unit pixels includes a first group disposed in a first row and a second group disposed in a second row spaced apart from the first row. The first group includes a first light emitting area emitting a first light, and a second light emitting area emitting a second light. The second group includes a light receiving area and third and fourth light emitting areas spaced apart from each other with the light receiving area interposed therebetween and emitting the third light. The fourth light emitting area of the first unit pixel and the third light emitting area of the second unit pixel are spaced apart from each other by a distance from about 25 micrometers to about 100 micrometers in the first direction.

20 Claims, 13 Drawing Sheets

(56)            References Cited

U.S. PATENT DOCUMENTS

|  |  |  |  |
|---|---|---|---|
| 10,957,749 | B2 | 3/2021 | Jung |
| 11,009,978 | B2 | 5/2021 | He |
| 11,594,582 | B2 | 2/2023 | Han et al. |
| 2018/0076267 | A1* | 3/2018 | Song .................... H10K 59/121 |
| 2018/0261655 | A1* | 9/2018 | Lee ........................ H10K 59/35 |
| 2019/0043420 | A1* | 2/2019 | Jung ................. G06V 40/1318 |
| 2019/0172385 | A1 | 6/2019 | Mori et al. |
| 2019/0341434 | A1 | 11/2019 | Lee et al. |
| 2021/0005669 | A1 | 1/2021 | Kamada et al. |
| 2021/0066669 | A1 | 3/2021 | Kubota et al. |
| 2021/0167144 | A1 | 6/2021 | Lim et al. |
| 2022/0181398 | A1* | 6/2022 | Jung ................... H10K 59/353 |
| 2022/0278177 | A1* | 9/2022 | Kubota ................. H10K 59/35 |
| 2024/0074272 | A1* | 2/2024 | Kubota ................. H10K 59/65 |
| 2024/0196675 | A1* | 6/2024 | Kimura ................. H10K 59/60 |

FOREIGN PATENT DOCUMENTS

|  |  |  |
|---|---|---|
| JP | 2021-12366 | 2/2021 |
| KR | 10-2021-0069776 | 6/2021 |

\* cited by examiner

DISPLAY DEVICE

CROSS-REFERENCE TO RELATED APPLICATION(S)

This U.S. non-provisional patent application claims priority to and benefits of Korean Patent Application No. 10-2022-0007420 under 35 U.S.C. § 119, filed on Jan. 18, 2022 in the Korean Intellectual Property Office, the entire contents of which are hereby incorporated by reference.

BACKGROUND

1. Technical Field

The disclosure relates to a display device including a light emitting area and a light receiving area.

2. Description of the Related Art

Multimedia display devices, such as televisions, mobile phones, tablet computers, navigation units, and game units, include a display device to display images and an input sensing device to sense external inputs. Recent display devices have a function to detect a fingerprint of a user.

As methods of sensing the user's fingerprint, there exist a capacitive method that senses a variation in capacitance formed between electrodes, an optical method that senses an incident light using an optical sensor, and an ultrasonic method that senses a vibration using a piezoelectric material. For a case where the optical sensor is employed in a display element layer, research is underway for an arrangement relation between a pixel and the optical sensor.

SUMMARY

The disclosure provides a display device having a superior sensitivity with respect to an external input and a high resolution.

The disclosure provides a display device in which processes of forming a light emitting area and a light receiving area are simplified.

Embodiments of the disclosure provide a display device that may include a first unit pixel, and a second unit pixel adjacent to the first unit pixel in a first direction. Each of the first unit pixel and the second unit pixel may include a first group disposed in a first row, and a second group disposed in a second row spaced apart from the first row in a second direction perpendicular to the first direction. The first group may include a first light emitting area emitting a first light, and a second light emitting area spaced apart from the first light emitting area by a first distance in the first direction and emitting a second light. The second group may include a light receiving area, a third light emitting area emitting a third light, and a fourth light emitting area emitting the third light and spaced apart from the third light emitting area by a second distance in the first direction such that the light receiving area may be disposed between the third light emitting area and the fourth light emitting area. The fourth light emitting area of the first unit pixel and the third light emitting area of the second unit pixel may be spaced apart from each other by a distance equal to or greater than about 25 micrometers and equal to or smaller than about 100 micrometers in the first direction.

The display device may further include a base layer, a display element layer disposed on the base layer, and an input sensing layer disposed on the display element layer.

The display element layer may include first, second, third, and fourth light emitting elements that are disposed to correspond to the first, second, third, and fourth light emitting areas and a light receiving element disposed to correspond to the light receiving area.

Each of the first, second, third, and fourth light emitting elements may include a first light emitting electrode, a hole transport region, a light emitting layer, an electron transport region, and a second electrode, which may be sequentially stacked on each other. The light receiving element may include a light receiving electrode, the hole transport region, a light receiving layer, the electron transport region, and the second electrode, which may be sequentially stacked on each other. The first light emitting element may further include a first resonance auxiliary layer disposed between the light emitting layer and the hole transport region. The third light emitting element may further include a first sub-resonance auxiliary layer disposed between the light emitting layer and the hole transport region. The fourth light emitting element may further include a second sub-resonance auxiliary layer disposed between the light emitting layer and the hole transport region. The light receiving element may further include a third sub-resonance auxiliary layer disposed between the light receiving layer and the hole transport region.

The first, second, and third sub-resonance auxiliary layers may be provided as a single layer.

Each of the first and second distances may be equal to or greater than about 10 micrometers and equal to or smaller than about 40 micrometers.

The second light emitting area and the light receiving area may overlap each other in the second direction, and a separation distance in the second direction between the second light emitting area and the light receiving area may be equal to or greater than about 10 micrometers and equal to or smaller than about 40 micrometers.

Each of the first unit pixel and the second unit pixel further may further include a fifth light emitting area disposed between the first light emitting area and the second light emitting area to emit the second light and a sixth light emitting area disposed between the fifth light emitting area and the second light emitting area to emit the first light.

The first light emitting area and the fifth light emitting area may be spaced apart from each other by a fifth distance in the first direction, the fifth light emitting area and the sixth light emitting area may be spaced apart from each other by a sixth distance in the first direction, the sixth light emitting area and the second light emitting area may be spaced apart from each other by a seventh distance in the first direction, and each of the fifth, sixth, and seventh distances may be equal to or greater than about 10 micrometers and equal to or smaller than about 40 micrometers.

The fifth light emitting area may overlap the third light emitting area in the second direction, the sixth light emitting area may overlap the light receiving area in the second direction, and the second light emitting area may overlap the fourth light emitting area in the second direction.

Each of a separation distance between the fifth light emitting area and the third light emitting area in the second direction, a separation distance between the sixth light emitting area and the light receiving area in the second direction, and a separation distance between the second light emitting area and the fourth light emitting area in the second direction may be equal to or greater than about 10 micrometers and equal to or smaller than about 40 micrometers.

Each of the first, second, third, and fourth light emitting areas and the light receiving area may have at least one of a lozenge shape, a square shape, and a rectangular shape when viewed in a plan view.

Each of the first unit pixel and the second unit pixel may include two light emitting areas disposed in the second row, and one light receiving area disposed in the second row.

The display device may further include a third unit pixel disposed adjacent to the first unit pixel in the second direction, and the third unit pixel may include a first-second light emitting area overlapping the first light emitting area of the first unit pixel in the second direction and emitting the second light, a second-second light emitting area spaced apart from the first-second light emitting area in the first direction, overlapping the second light emitting area of the first unit pixel in the second direction, and emitting the first light, a third-second light emitting area overlapping the first-second light emitting area in the second direction and emitting the third light, a fourth-second light emitting area spaced apart from the third-second light emitting area in the first direction, overlapping the fourth light emitting area of the first unit pixel in the second direction, and emitting the third light, and a second light receiving area disposed between the third-second light emitting area and the fourth-second light emitting area.

Embodiments of the disclosure provide a display device that may include a first unit pixel, a second unit pixel adjacent to the first unit pixel in a first direction, a base layer, a display element layer disposed on the base layer and including a pixel definition layer through which an opening may be defined, first, second, third, and fourth light emitting elements that are distinguished from each other by the pixel definition layer, and a light receiving element, and an input sensing layer disposed on the display element layer. Each of the first, second, third, and fourth light emitting elements and the light receiving element may include a first electrode, a hole transport region, an electron transport region, and a second electrode, which may be sequentially stacked on each other. The first light emitting element may further include a first resonance auxiliary layer disposed between the hole transport region and the electron transport region and a first light emitting layer disposed between the first resonance auxiliary layer and the electron transport region and emitting a first light. The second light emitting element may further include a second light emitting layer disposed between the hole transport region and the electron transport region and emitting a second light. The third light emitting element may further include a first sub-resonance auxiliary layer disposed between the hole transport region and the electron transport region and a third light emitting layer disposed between the first sub-resonance auxiliary layer and the electron transport region and emitting a third light. The fourth light emitting element may further include a second sub-resonance auxiliary layer disposed between the hole transport region and the electron transport region and a fourth light emitting layer disposed between the second sub-resonance auxiliary layer and the electron transport region and emitting the third light. The light receiving element may further include a third sub-resonance auxiliary layer disposed between the hole transport region and the electron transport region and a light receiving layer disposed between the first sub-resonance auxiliary layer and the electron transport region. The first, second, and third sub-resonance auxiliary layers may be provided as a single layer.

When viewed in a plan view, each of the first unit pixel and the second unit pixel may include a first group disposed in a first row, and a second group disposed in a second row spaced apart from the first row in a second direction perpendicular to the first direction. The first group may include a first light emitting area corresponding to the first light emitting element, and a second light emitting area spaced apart from the first light emitting area by a first distance in the first direction and corresponding to the second light emitting element. The second group may include a light receiving area corresponding to the light receiving element, a third light emitting area corresponding to the third light emitting element, and a fourth light emitting area corresponding to the fourth light emitting element and spaced apart from the third light emitting area by a second distance in the first direction such that the light receiving area may be disposed between the third light emitting area and the fourth light emitting area.

The fourth light emitting area of the first unit pixel may be spaced apart from the third light emitting area of the second unit pixel by a third distance in the first direction, and the third distance may be greater than each of the first and second distances.

The third distance may be equal to or greater than about 25 micrometers and equal to or smaller than about 100 micrometers.

A separation distance in the second direction between the second light emitting area and the light receiving area may be equal to or greater than about 10 micrometers and equal to or smaller than about 40 micrometers.

Each of the first unit pixel and the second unit pixel may further include a fifth light emitting area disposed between the first light emitting area and the second light emitting area and emitting the second light, and a sixth light emitting area disposed between the fifth light emitting area and the second light emitting area and emitting the first light.

The first light emitting area and the fifth light emitting area may be spaced apart from each other by a fifth distance in the first direction, the fifth light emitting area and the sixth light emitting area may be spaced apart from each other by a sixth distance in the first direction, the sixth light emitting area and the second light emitting area may be spaced apart from each other by a seventh distance in the first direction, and each of the fifth, sixth, and seventh distances may be equal to or greater than about 10 micrometers and equal to or smaller than about 40 micrometers.

According to the above, in the display device, a ratio of the number of the light emitting areas to the number of the light receiving areas may be 2:1, the distance between the light emitting area and the light receiving area may be adjusted, and thus, the display device has a superior sensitivity with respect to an external input and a high resolution.

In the display device, a ratio of the number of the green light emitting areas to the number of the light receiving areas may be 2:1, the distance between the green light emitting area and the light receiving area may be adjusted, and thus, an area to increase an aperture ratio and an area to form a rib of a mask may be secured.

BRIEF DESCRIPTION OF THE DRAWINGS

The above and other advantages of the disclosure will become readily apparent by reference to the following detailed description when considered in conjunction with the accompanying drawings wherein:

FIG. 4B is a schematic plan view of a portion of a display module according to an embodiment of the disclosure;

FIG. 4C is a schematic plan view of a portion of a display module according to an embodiment of the disclosure;

DETAILED DESCRIPTION OF THE EMBODIMENTS

Figure 1:
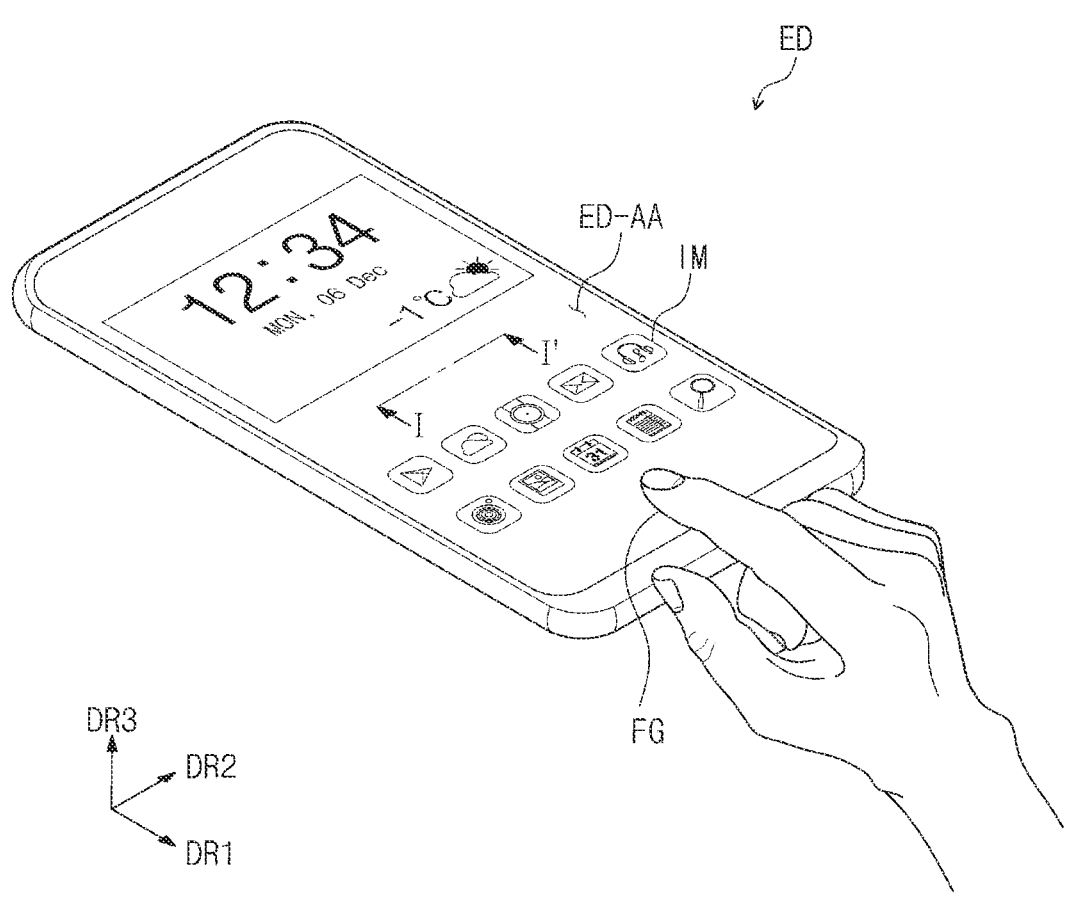
FIG. 1 is a schematic perspective view of a display device according to an embodiment of the disclosure.

The disclosure may be variously modified and realized in many different forms, and thus only a few specific embodiments will be disclosed in the drawings and described in detail hereinbelow. However, the disclosure should not be limited to the specific disclosed forms, and should be construed to include all modifications, equivalents, or replacements included in the spirit and scope of the disclosure.

It will be understood that when an element (or area, layer, or portion) is referred to as being "on", "connected to" or "coupled to" another element or layer, it can be directly on, connected or coupled to the other element or layer or intervening elements or layers may be present.

In the disclosure, when an element is referred to as being "directly disposed" to another element, there may be no intervening elements present between a layer, film region, or substrate and another layer, film, region, or substrate. For example, the term "directly disposed" may mean that two layers or two members are disposed without employing additional adhesive therebetween.

Like numerals refer to like elements throughout. In the drawings, the thickness, ratio, and dimension of components may be exaggerated for effective description of the technical content. As used herein, the term "and/or" may include any and all combinations of one or more of the associated listed items. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean any combination including "A, B, or A and B."

It will be understood that, although the terms" first," "second," etc. may be used herein to describe various elements, these elements should not be limited by these terms. These terms are only used to distinguish one element from another element. Thus, a first element discussed below could be termed a second element without departing from the teachings of the disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element or feature as shown in the figures.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value.

Figure 2:
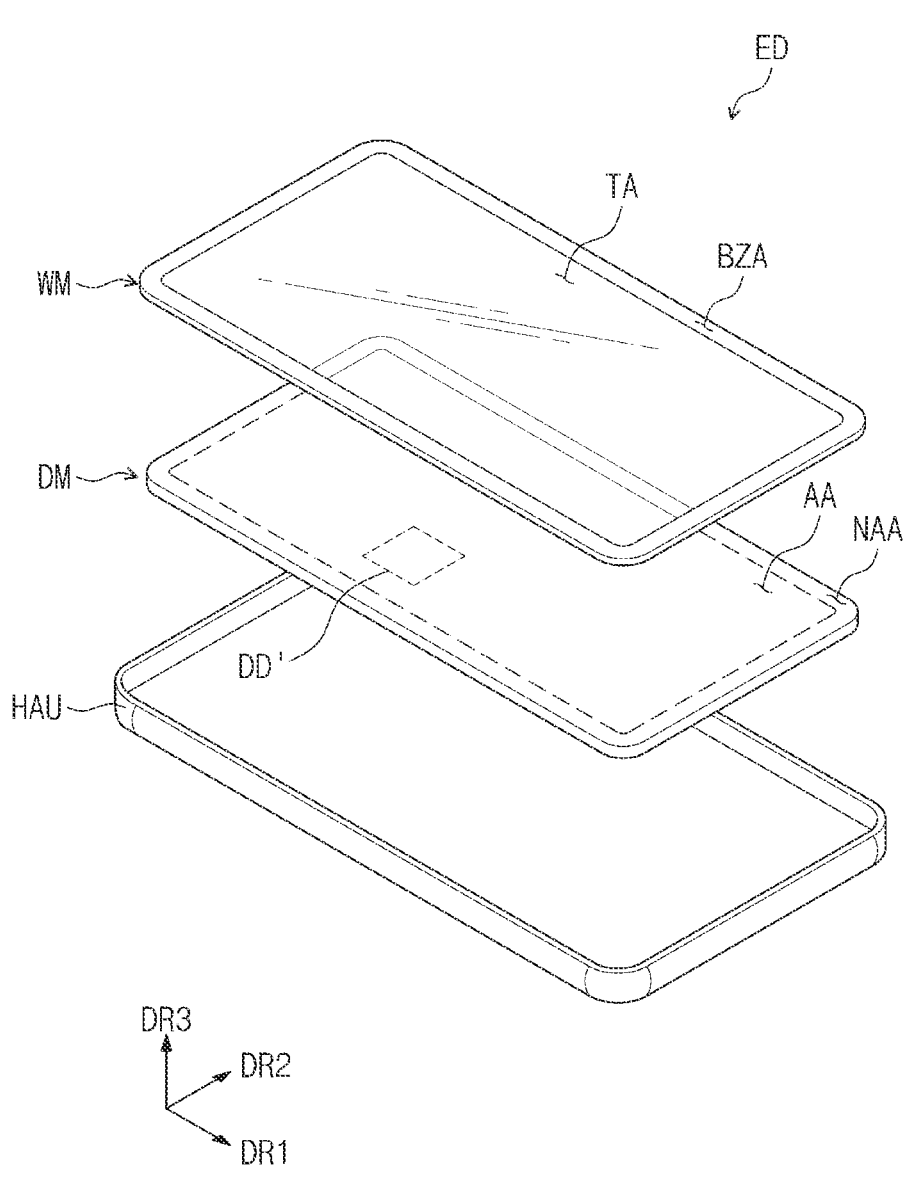
FIG. 2 is an exploded schematic perspective view of a display device according to an embodiment of the disclosure.
Figure 3:
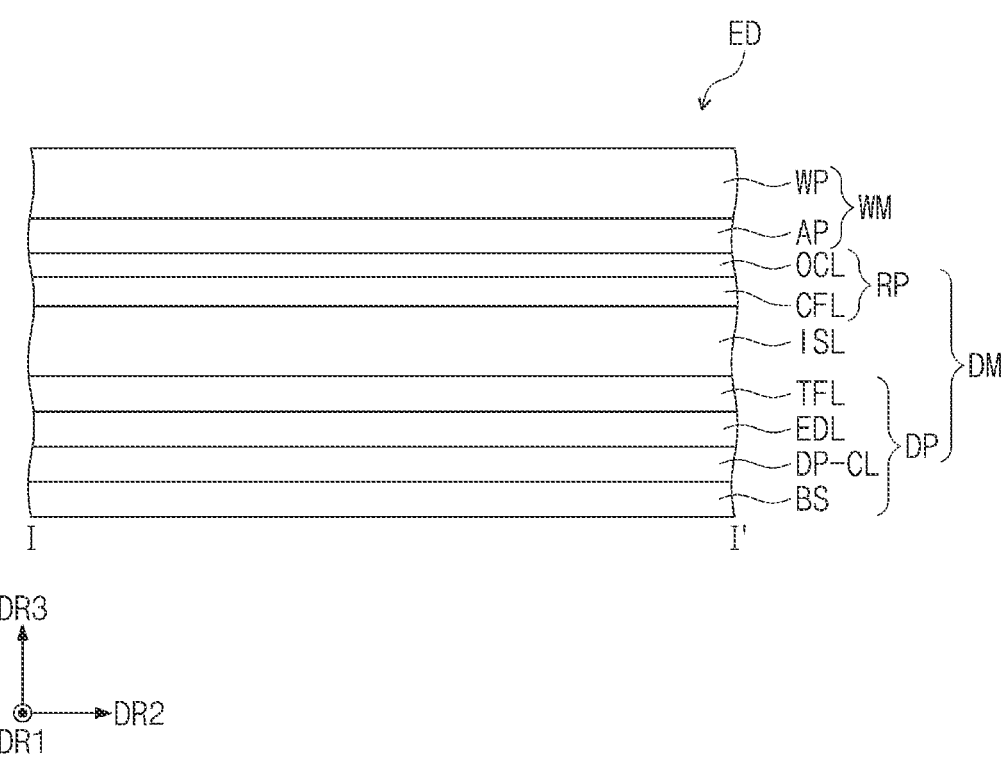
FIG. 3 is a schematic cross-sectional view of a display device according to an embodiment of the disclosure.

FIG. 1 is a schematic perspective view of a display device ED according to an embodiment of the disclosure. FIG. 2 is an exploded schematic perspective view of the display device ED according to an embodiment of the disclosure. FIG. 3 is a schematic cross-sectional view of the display device ED according to an embodiment of the disclosure.

The display device ED shown in FIGS. 1 to 3 may be a device that is activated in response to electrical signals. As an example, the display device ED may be a mobile phone, a tablet computer, a car navigation unit, a game unit, or a wearable device, however, it should not be limited thereto or thereby. FIG. 1 shows the mobile phone as a representative example of the display device ED.

The display device ED may display an image IM through an active area ED-AA. The active area ED-AA may include a plane defined by a first directional axis DR1 and a second directional axis DR2. The active area ED-AA may further include a curved surface bent from at least one side of the plane defined by the first directional axis DR1 and the second directional axis DR2. For example, the active area ED-AA may include only the plane, or the active area ED-AA may further include two or more curved surfaces, e.g., four curved surfaces respectively bent from four sides of the plane.

FIG. 1 shows the first, second, and third directional axes DR1, DR2, and DR3. In the following descriptions, directions indicated by the first, second, and third directional axes DR1, DR2, and DR3 may be relative to each other and may be changed to other directions. The directions indicated by the first, second, and third directional axes DR1, DR2, and DR3 may be referred to as first, second, and third directions, respectively, and the first, second, and third directions may be assigned with the same reference numerals as those of the first, second, and third directional axes DR1, DR2, and DR3.

A thickness direction of the display device ED may be substantially parallel to the third directional axis DR3 that may be the normal line direction of the plane defined by the first directional axis DR1 and the second directional axis DR2. In an embodiment, front (or upper) and rear (or lower) surfaces of each member of the display device ED may be defined with respect to the third directional axis DR3.

According to an embodiment, the image IM provided from the display device ED may include a still image and/or a video. FIG. 1 shows a clock widget and application icons as representative examples of the image IM. A surface through which the image IM may be displayed may correspond to a front surface of the display device ED and a front surface of a window member WM.

According to an embodiment, the display device ED may sense a user input applied thereto from the outside. The user input may include various types of external inputs, such as a part of a user's body, light, heat, or pressure. According to an embodiment, the display device ED may sense the user input through the active area ED-AA and may respond to the sensed input. The display device ED may sense the user input applied to a side or rear surface of the display device ED depending on its design, however, configurations should not be limited to a specific embodiment.

As an example, the display device ED may sense biometric information applied thereto from the outside, such as a user's fingerprint FG. The display device ED may include a fingerprint recognition area defined in the active area ED-AA. The fingerprint recognition area may be defined in an entire portion of the active area ED-AA or may be defined in a portion of the active area ED-AA.

Referring to FIGS. 2 and 3, the display device ED may include a display module DM, the window member WM, and a housing HAU. According to an embodiment, the window member WM and the housing HAU may be physically connected to each other to form an external appearance of the display device ED.

According to an embodiment, the display module DM may include an active area AA and a peripheral area NAA, which may be defined therein. The active area AA may be activated in response to electrical signals. As described above, the active area AA may be an area in which the image is displayed or the external input is sensed.

The peripheral area NAA may be defined adjacent to at least one side of the active area AA. The peripheral area NAA may be defined to surround the active area AA, however, the disclosure should not be limited thereto or thereby. Different from that shown in FIG. 2, according to an embodiment, a portion of the peripheral area NAA may be omitted. A driving circuit or a driving line may be arranged in the peripheral area NAA to drive the active area AA.

According to an embodiment, the display module DM may include a display panel DP and an anti-reflective member RP. The display module DM may include an input sensing layer ISL (IS-IL1, IS-CL1, IS-IL2, IS-CL2, IS-IL3) disposed between the display panel DP and the anti-reflective member RP.

The display panel DP may include a base layer BS and a display element layer EDL disposed on the base layer BS. The display panel DP may include the base layer BS, a circuit layer DP-CL disposed on the base layer BS, the display element layer EDL disposed on the circuit layer DP-CL, and an encapsulation layer TFL disposed on the display element layer EDL. The encapsulation layer TFL may cover the display element layer EDL.

The display device ED may further include the window member WM disposed on the display module DM. The window member WM may include a window WP and an adhesive layer AP, and the adhesive layer AP may be disposed between the anti-reflective member RP and the window WP. The adhesive layer AP may be an optically clear adhesive (OCA) film or an optically clear adhesive resin (OCR) layer. According to an embodiment, the adhesive layer AP may be omitted.

The window WP may cover an entire outer side of the display module DM. The window WP may have a shape corresponding to a shape of the display module DM. According to an embodiment, the window WP of the display device ED may include an optically transparent insulating material. The window WP may be a glass substrate or a polymer substrate. As an example, the window WP may be a tempered glass substrate. The window WP may be an uppermost layer of the display device ED.

According to an embodiment, the window member WM of the display device ED may include a transmissive area TA and a bezel area BZA, which are defined therein. The transmissive area TA may correspond to the active area AA of the display module DM, and the bezel area BZA may correspond to the peripheral area NAA of the display module DM.

The front surface of the window member WM, which may include the transmissive area TA and the bezel area BZA, may correspond to the front surface of the display device ED. The user may view the image provided through the transmissive area TA corresponding to the front surface of the display device ED.

The bezel area BZA may define a shape of the transmissive area TA. The bezel area BZA may be adjacent to the transmissive area TA and may surround the transmissive area TA, however, the embodiment should not be limited thereto or thereby. According to an embodiment, the bezel area BZA may be disposed adjacent to only one side of the transmissive area TA or may be partially omitted.

According to an embodiment, a portion of the display device ED, which may be recognized through the bezel area BZA of the display device ED, may have a relatively low light transmittance compared with that of a portion of the display device ED, which may be recognized through the transmissive area TA of the display device ED. The bezel area BZA of the display device ED may have a predetermined or selectable color.

According to an embodiment, the anti-reflective member RP of the display device ED may include a color filter layer CFL (CF, BM) and an organic planarization layer OCL. As an example, the anti-reflective member RP may reduce a reflectance with respect to an external light incident thereto from the outside or may absorb and block a portion of the light incident thereto from the outside.

According to an embodiment, the input sensing layer ISL included in the display device ED may be disposed on the display panel DP. The input sensing layer ISL may sense the external input applied thereto from the outside. The external input may be the user input. The user input may include various types of external inputs, such as a part of a user's body, light, heat, pen, or pressure.

Figure 4A:
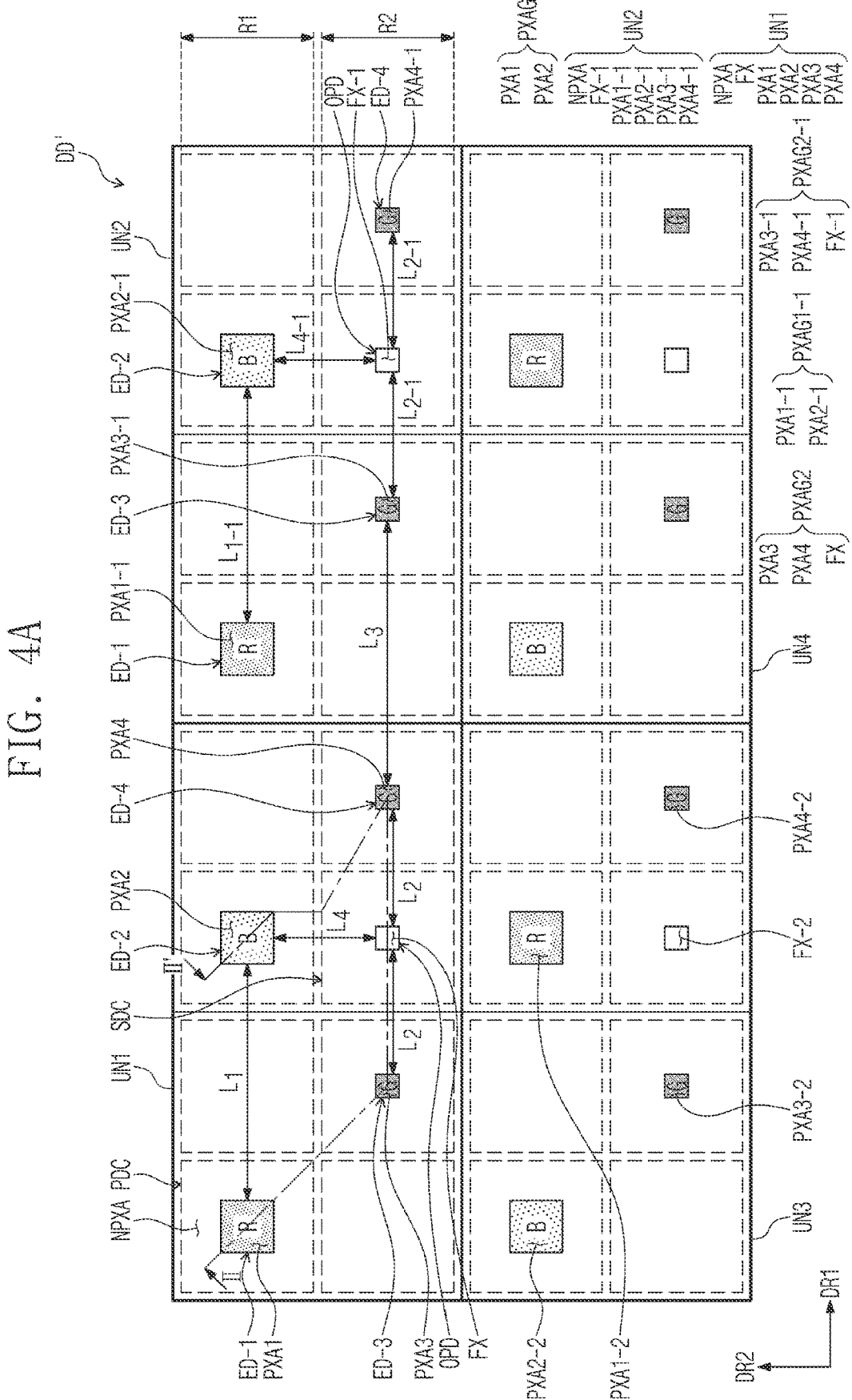
FIG. 4A is a schematic plan view of a portion of a display module according to an embodiment of the disclosure.
Figure 4B:
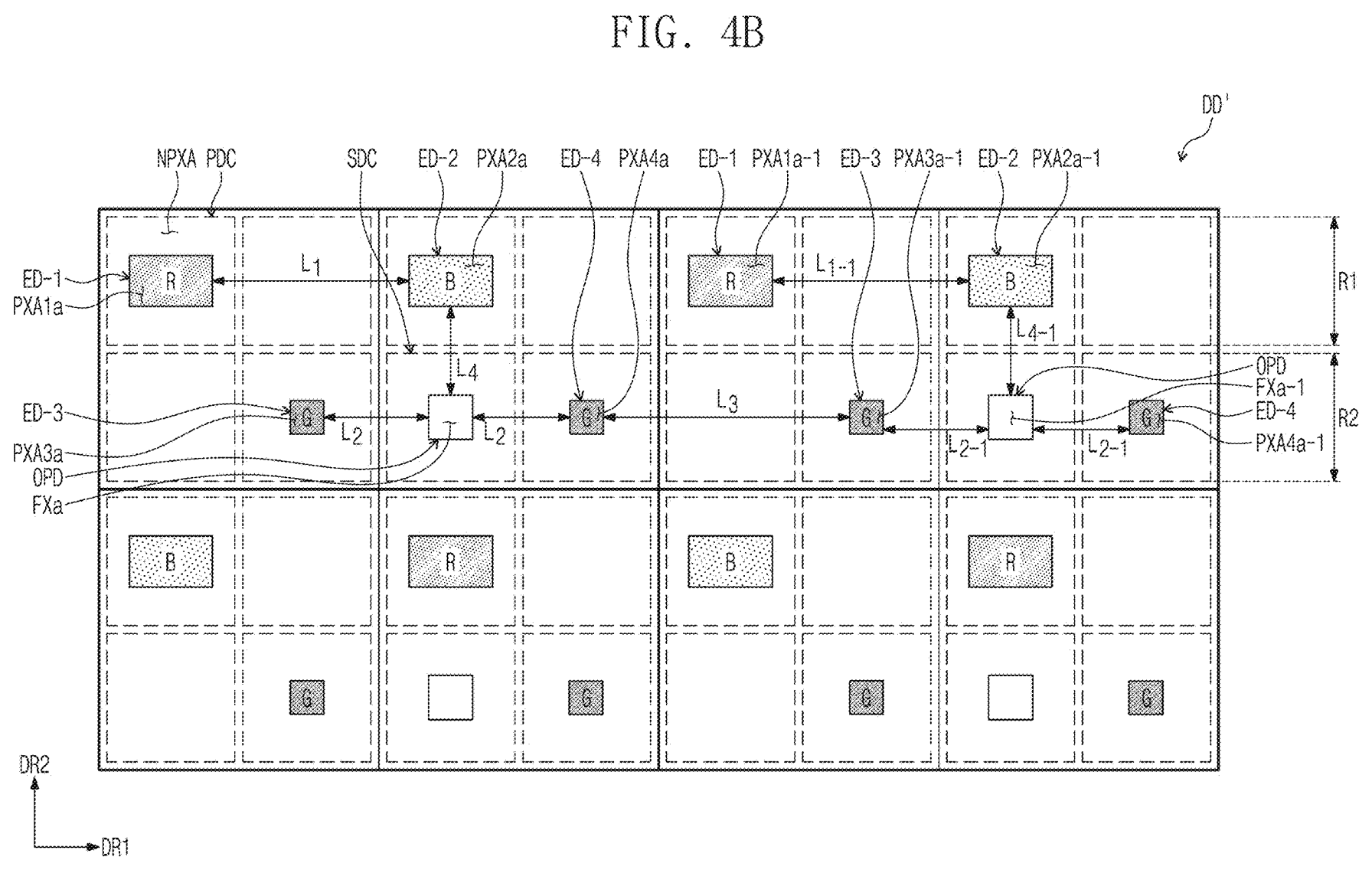
Figure 4C:
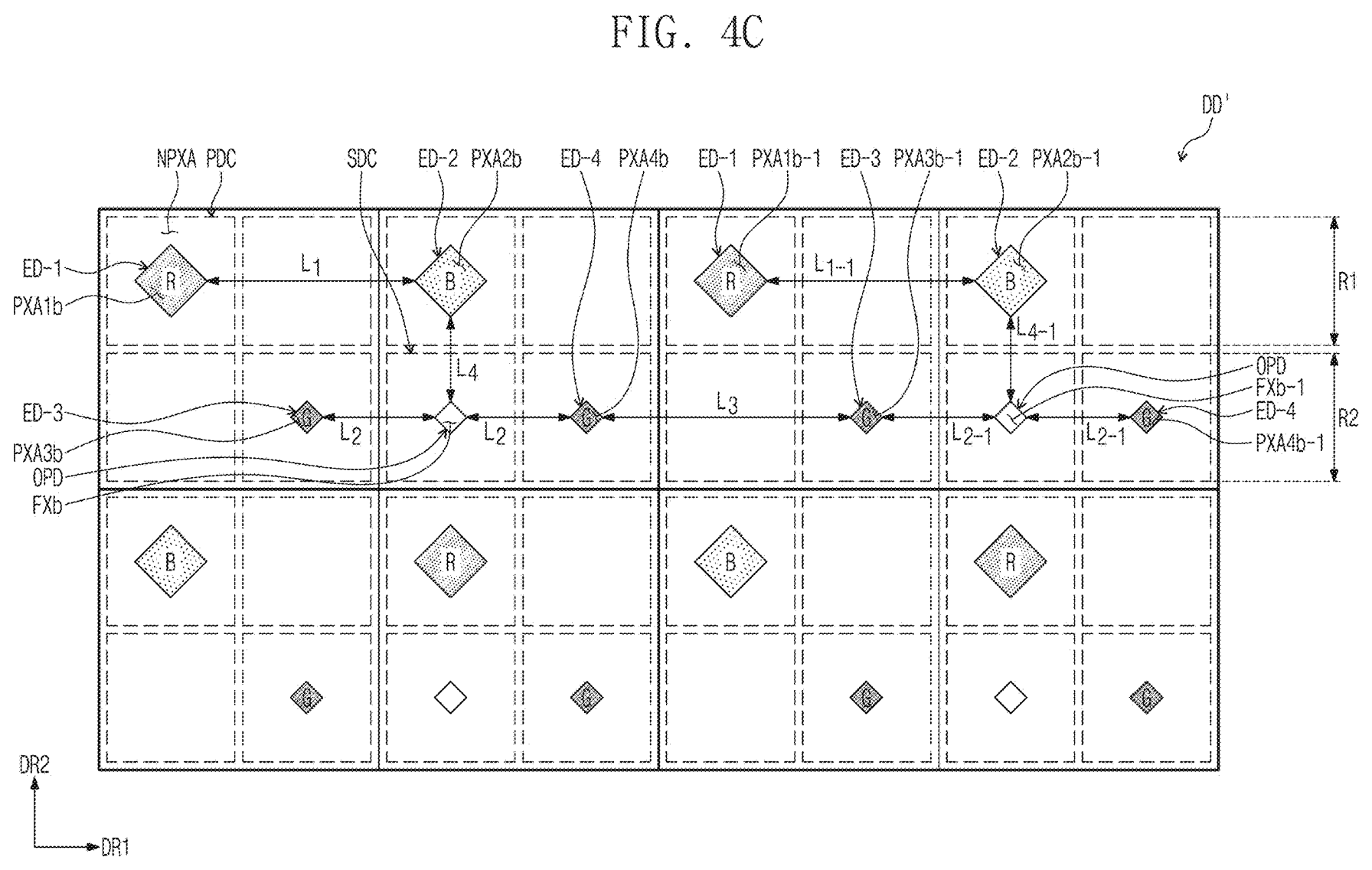
Figure 5:
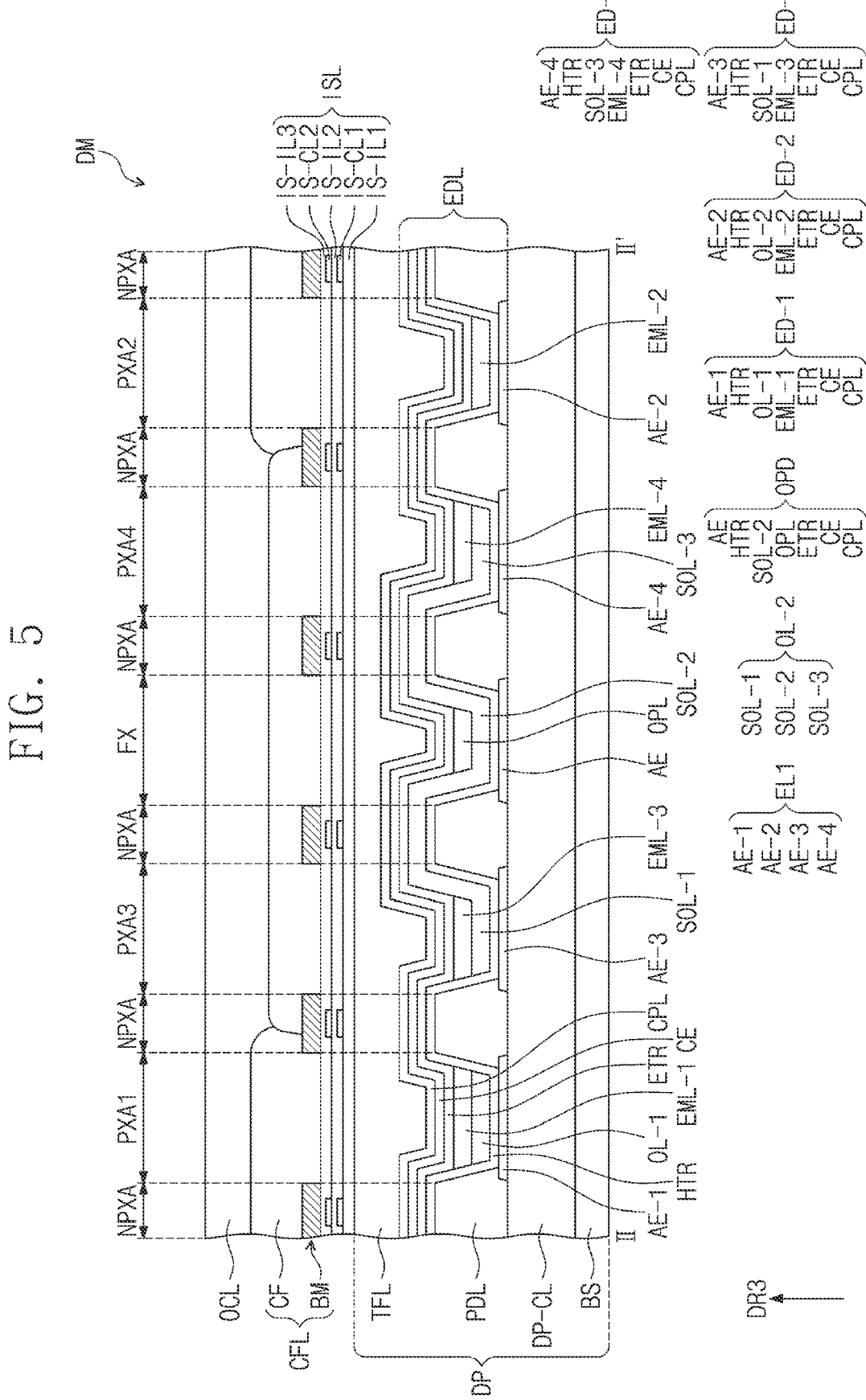
FIG. 5 is a schematic-sectional view of a portion of a display module according to an embodiment of the disclosure.

FIGS. 4A to 4C are schematic plan views of a portion of the display module according to embodiments of the disclosure. FIGS. 4A to 4C are plan views of an area DD' of FIG. 2. FIG. 5 is a schematic cross-sectional view of a portion of the display module DM according to an embodiment of the disclosure. FIG. 5 is a cross-sectional view taken along a line II-II' of FIG. 4A.

Referring to FIGS. 4A and 5, the display module DM may include a first unit pixel UN1 and a second unit pixel UN2 adjacent to the first unit pixel UN1 in the first direction DR1. The first unit pixel UN1 may include multiple light emitting areas PXA1, PXA2, PXA3, and PXA4 and at least one light receiving area FX. In detail, the first unit pixel UN1 may include four light emitting areas PX1, PXA2, PXA3, and PXA4 and one light receiving area FX, however, this is merely an example. The first unit pixel UN1 may include a non-light emitting region NPXA. The non-light emitting region NPXA may be regions between the adjacent light emitting regions PXA1, PXA2, PXA3 and PXA4, and may be regions corresponding to the pixel definition layer PDL.

The light emitting areas PX1, PXA2, PXA3, and PXA4 may include light emitting elements ED-1, ED-2, ED-3, and ED-4, respectively, and a light emitting driving circuit PDC. The light receiving area FX may include a light receiving element OPD and a light receiving driving circuit SDC.

The first unit pixel UN1 may include a first group PXAG1 disposed in a first row R1 and a second group PXAG2 disposed in a second row R2 spaced apart from the first row R1 in the second direction DR2.

The first group PXAG1 may include a first light emitting area PXA1 from which a first light (e.g., red R) is emitted and a second light emitting area PXA2 from which a second light (e.g., blue B) is emitted. The first light emitting area PXA1 and the second light emitting area PXA2 of the first group PXAG1 may be arranged in a line along the first direction DR1. The second light emitting area PXA2 may be spaced apart from the first light emitting area PXA1 by a first distance $L_1$ in the first direction DR1. The first distance $L_1$ may correspond to a distance between upper surfaces adjacent to each other of portions of a pixel definition layer PDL (refer to FIG. 5), which define the first light emitting area PXA1 and the second light emitting area PXA2 in the cross-sectional view shown in FIG. 5. Hereinafter, a distance between the light emitting areas and a distance between the light emitting area and the light receiving area may be defined as the distance between the upper surfaces adjacent to each other of the portions of the pixel definition layer PDL. The upper surface of the pixel definition layer PDL (refer to FIG. 5) may be a surface adjacent to the encapsulation layer TFL (refer to FIG. 5).

The first distance $L_1$ may be equal to or greater than about 10 μm and equal to or smaller than about 40 μm. As the first distance $L_1$ may be adjusted to be equal to or greater than about 10 μm and equal to or smaller than about 40 μm, an area required to form a rib of a mask that may be used to form the first light emitting area PXA1 and the second light emitting area PXA2 may be secured, and thus, the display device ED (refer to FIG. 1) with a high resolution may be implemented. In case that the first distance $L_1$ is smaller than about 10 μm, the area for the rib of the mask used to form each of the first light emitting area PXA1 and the second light emitting area PXA2 may not be secured. In case that the first distance $L_1$ is greater than about 40 μm, the distance between the light emitting areas may increase, and as a result, the resolution of the display device ED (refer to FIG. 1) may be deteriorated.

The second group PXAG2 may include a third light emitting area PXA3 from which a third light (e.g., green G) is emitted, a fourth light emitting area PXA4 from which the third light is emitted, and the light receiving area FX receiving the light incident thereto from the outside. The third light emitting area PXA3, the light receiving area FX, and the fourth light emitting area PXA4 of the second group PXAG2 may be arranged in the first direction DR1. The light receiving area FX may be disposed between the third light emitting area PXA3 and the fourth light emitting area PXA4. Each of the third light emitting area PXA3 and the fourth light emitting area PXA4 may be disposed spaced apart from the light receiving area FX by a second distance $L_2$ in the first direction DR1. The second distance $L_2$ may be equal to or greater than about 10 μm and equal to or smaller than about 40 μm. As the second distance $L_2$ may be adjusted to be equal to or greater than about 10 μm and equal to or smaller than about 40 μm, an area for a rib of a mask used to form the third light emitting area PXA3, the fourth light emitting area PXA4, and the light receiving area FX may be secured, and the display device ED (refer to FIG. 1) with high resolution may be implemented. In detail, in case that the second distance $L_2$ is smaller than about 10 μm, the area for the rib of the mask used to form the third light emitting area PXA3, the light receiving area FX, and the fourth light emitting area PXA4 may not be secured, and in case that the second distance $L_2$ is greater than about 40 μm, the distance between the light emitting areas may increase, and as a result, the resolution of the display device ED (refer to FIG. 1) may be deteriorated.

According to an embodiment, the second group PXAG2 may not include the light emitting area and the light receiving area in a portion corresponding to the first light emitting area PXA1 in the second direction DR2. The second distance $L_2$ may be adjusted to be equal to or greater than about 10 μm and equal to or smaller than about 40 μm while maintaining an aperture ratio of the third light emitting area PXA3, the fourth light emitting area PXA4, and the light receiving area FX compared to the case where the second group PXAG2 includes the light emitting area or the light receiving area in the portion corresponding to the first light emitting area PXA1 in the second direction DR2. A third distance $L_3$ described later may be adjusted to be equal to or greater than about 25 μm and equal to or smaller than about 100 μm while maintaining the aperture ratio of the third light emitting area PXA3, the fourth light emitting area PXA4, and the light receiving area FX.

The second unit pixel UN2 may include a first group PXAG1-1 disposed in the first row R1 and a second group PXAG2-1 disposed in the second row R2 spaced apart from the first row R1 in the second direction DR2.

The first group PXAG1-1 may include a first light emitting area PXA1-1 from which the first light is emitted and a second light emitting area PXA2-1 from which the second light is emitted. The first light emitting area PXA1-1 and the second light emitting area PXA2-1 of the first group PXAG1-1 may be arranged in the first direction DR1. The second light emitting area PXA2-1 may be spaced apart from the first light emitting area PXA1-1 by a first distance $L_{1-1}$ in the first direction DR1.

The first distance $L_{1-1}$ may be equal to or greater than about 10 μm and equal to or smaller than about 40 μm. As the first distance $L_{1-1}$ may be adjusted to be equal to or greater than about 10 μm and equal to or smaller than about 40 μm, an area required to form a rib of a mask that may be used to form the first light emitting area PXA1-1 and the second light emitting area PXA2-1 may be secured, and thus, the display device ED (refer to FIG. 1) with high resolution may be implemented. In case that the first distance $L_{1-1}$ is smaller than about 10 μm, the area for the rib of the mask used to form each of the first light emitting area PXA1-1 and the second light emitting area PXA2-1 may not be secured. In case that the first distance $L_{1-1}$ is greater than about 40 μm, the resolution of the display device ED (refer to FIG. 1) may be deteriorated.

The second group PXAG2-1 may include a third light emitting area PXA3-1 from which the third light is emitted, a fourth light emitting area PXA4-1 from which the third light is emitted, and a light receiving area FX-1 receiving a light incident thereto from the outside. The third light emitting area PXA3-1, the light receiving area FX-1, and the fourth light emitting area PXA4-1 of the second group PXAG2-1 may be arranged in a line along the first direction DR1. The light receiving area FX-1 may be disposed between the third light emitting area PXA3-1 and the fourth light emitting area PXA4-1.

Each of the third light emitting area PXA3-1 and the fourth light emitting area PXA4-1 may be disposed spaced apart from the light receiving area FX-1 by a second distance $L_{2-1}$ in the first direction DR1. The second distance $L_{2-1}$ may be equal to or greater than about 10 μm and equal to or smaller than about 40 μm. As the second distance $L_{2-1}$ may be adjusted to be equal to or greater than about 10 μm and equal to or smaller than about 40 μm, an area for a rib of a mask used to form the third light emitting area PXA3-1, the fourth light emitting area PXA4-1, and the light receiving area FX-1 may be secured, and the display device ED (refer to FIG. 1) with high resolution may be implemented. In case that the second distance $L_{2-1}$ is smaller than about 10 μm, the area for the rib of the mask used to form each of the third light emitting area PXA3-1 and the fourth light emitting area PXA4-1 may not be secured. In case that the second distance $L_{2-1}$ is greater than about 40 μm, the resolution and sensitivity with respect to the external input of the display device ED (refer to FIG. 1) may be deteriorated.

According to an embodiment, the second group PXAG2-1 may not include the light emitting area and the light receiving area in a portion corresponding to the first light emitting area PXA1-1 in the second direction DR2. In a case where the second distance $L_{2-1}$ may be adjusted to be equal to or greater than about 10 μm and equal to or smaller than about 40 μm while maintaining the aperture ratio of the third light emitting area PXA3-1, the fourth light emitting area PXA4-1, and the light receiving area FX-1 compared to the case where the second group PXAG2-1 includes the light emitting area or the light receiving area in the portion corresponding to the first light emitting area PXA1-1 in the second direction DR2. A third distance $L_3$ described later may be adjusted to be equal to or greater than about 25 μm and equal to or smaller than about 100 μm while maintaining the aperture ratio of the third light emitting area PXA3-1, the fourth light emitting area PXA4-1, and the light receiving area FX-1.

The light emitting areas and the light receiving area in each of the first unit pixel UN1 and the second unit pixel UN2 may be arranged in the same pattern.

The fourth light emitting area PXA4 of the first unit pixel UN1 and the third light emitting area PXA3-1 of the second unit pixel UN2 may be spaced apart from each other by the third distance $L_3$ in the first direction DR1. The third distance $L_3$ may be greater than each of the first distance $L_1$ and the second distance $L_2$. As an example, a difference between the third distance $L_3$ and the first distance $L_1$ may be equal to or greater than about 15 μm and equal to or smaller than about 60 μm, and a difference between the third distance $L_3$ and the second distance $L_2$ may be equal to or greater than about 15 μm and equal to or smaller than about 60 μm.

The third distance $L_3$ may be equal to or greater than about 25 μm and equal to or smaller than about 100 μm. As the third distance $L_3$ may be adjusted to be equal to or greater than about 25 μm and equal to or smaller than about 100 μm, the display module DM may secure an area required to form a rib of a mask, which may be used to form the unit pixels UN1 and UN2, between the unit pixels UN1 and UN2 when viewed in a plan view. In detail, as the third distance $L_3$ may be adjusted to be equal to or greater than about 25 μm and equal to or smaller than about 100 μm, sub-resonance auxiliary layers SOL-1, SOL-2, and SOL-3 of the second light emitting areas PXA2 and PXA2-1, the light receiving areas FX and FX-1, and the third light emitting areas PXA3 and PXA3-1 may be substantially simultaneously deposited through one process using one mask in each of the first unit pixel UN1 and the second unit pixel UN2. Accordingly, the number of masks used in entire processes performed to manufacture the display device ED may be reduced, and the processes performed to manufacture the display device ED may be simplified.

In the first unit pixel UN1, the second light emitting area PXA2 and the light receiving area FX may be disposed to overlap each other in the second direction DR2. A separation distance $L_4$ (hereinafter, referred to as a fourth distance) in the second direction DR2 between the second light emitting area PXA2 and the light receiving area FX may be equal to or greater than about 10 μm and equal to or smaller than about 40 μm. As the fourth distance $L_4$ may be adjusted to be equal to or greater than about 10 μm and equal to or smaller than about 40 μm, the display module DM may secure the area for the rib of the mask used to form the second light emitting area PXA2 and the light receiving area FX, and the display device ED (refer to FIG. 1) with high resolution and sensitivity may be implemented. In case that the fourth distance $L_4$ is smaller than about 10 μm, the area for the mask required to form each of the second light emitting area PXA2 and the light receiving area FX may not be secured. In case that the fourth distance $L_4$ is greater than about 40 μm, the resolution and the sensitivity with respect to the external input of the display device ED (refer to FIG. 1) may be deteriorated.

In the second unit pixel UN2, the second light emitting area PXA2-1 and the light receiving area FX-1 may be disposed to overlap each other in the second direction DR2. A separation distance $L_{4-1}$ (hereinafter, referred to as a fourth distance) in the second direction DR2 between the second light emitting area PXA2-1 and the light receiving area FX-1 may be equal to or greater than about 10 μm and equal to or smaller than about 40 μm. As the fourth distance $L_{4-1}$ may be adjusted to be equal to or greater than about 10 μm and equal to or smaller than about 40 μm, the display module DM may secure the area for the rib of the mask used to form the second light emitting area PXA2-1 and the light receiving area FX-1, and the display device ED (refer to FIG. 1) with high resolution and sensitivity may be implemented. In case that the fourth distance $L_{4-1}$ is smaller than about 10 μm, the area for the rib of the mask required to form each of the second light emitting area PXA2-1 and the light receiving area FX-1 may not be secured. In case that the fourth distance $L_{4-1}$ is greater than about 40 μm, the resolution and the sensitivity with respect to the external input of the display device ED (refer to FIG. 1) may be deteriorated.

The display module DM may further include a third unit pixel UN3 disposed to overlap the first unit pixel UN1 in the second direction DR2 and a fourth unit pixel UN4 disposed adjacent to the second unit pixel UN2 in the second direction DR2. The third unit pixel UN3 may include a second-second light emitting area PXA2-2 emitting the second light in a portion overlapping the first light emitting area PXA1 of the first unit pixel UN1 in the second direction DR2 and a first-second light emitting area PXA1-2 emitting the first light in a portion overlapping the second light emitting area PXA2 of the first unit pixel UN1 in the second direction DR2. The third unit pixel UN3 may include a third-second light emitting area PXA3-2, a second light receiving area FX-2, and a fourth-second light emitting area PXA4-2, which may be disposed to respectively overlap the third light emitting area PXA3, the light receiving area FX, and the fourth light emitting area PXA4 of the first unit pixel UN1 in the second direction DR2. The third-second light emitting area PXA3-2 and the fourth-second light emitting area PXA4-2 may emit the third light.

In the arrangement relation of the light emitting areas and the light receiving area, the arrangement relation between the first unit pixel UN1 and the third unit pixel UN3 may be applied to the arrangement relation between the second unit pixel UN2 and the fourth unit pixel UN4.

When viewed in a plan view, a size of each of the first light emitting areas PXA1 and PXA1-1 and a size of each of the second light emitting areas PXA2 and PXA2-1 may be greater than a size of each of the third light emitting areas PXA3 and PXA3-1, the light receiving areas FX and FX-1, and the fourth light emitting areas PXA4 and PXA4-1. Each of the first to fourth light emitting areas PXA1, PXA2, PXA3, PXA4, PXA1-1, PXA2-1, PXA3-1, and PXA4-1 and each of the light receiving areas FX and FX-1 may have a square shape, however, these shapes are merely examples. According to an embodiment, the shape and the size of each of the first to fourth light emitting areas PXA1, PXA2, PXA3, PXA4, PXA1-1, PXA2-1, PXA3-1, and PXA4-1 and each of the light receiving areas FX and FX-1 should not be limited thereto or thereby.

As an example, referring to FIG. 4B, each of first light emitting areas PXA1a and PXA1a-1 and each of second light emitting areas PXA2a and PXA2a-1 may have a rectangular shape when viewed in a plan view. In detail, in each of the first light emitting areas PXA1a and PXA1a-1 and each of the second light emitting areas PXA2a and PXA2a-1, sides extending in the first direction DR1 may have a length greater than a length of sides extending in the second direction DR2. When viewed in a plan view, a size of light receiving areas FXa and FXa-1 may be greater than a size of third light emitting areas PXA3a and PXA3a-1. When viewed in a plan view, the size of the light receiving areas FXa to FXa-1 may be smaller than the size of the first light emitting areas PXA1a and PXA1a-1 and the size of the second light emitting areas PXA2a and PXA2a-1.

Referring to FIG. 4C, each of first to fourth light emitting areas PXA1b, PXA2b, PXA3b, and PXA4b, each of first to fourth light emitting areas PXA1b-1, PXA2b-1, PXA3b-1, and PXA4b-1, and each of the light receiving areas FXb and FXb-1 may have a lozenge shape when viewed in a plan view.

For example, as shown in FIG. 4B each of the first to fourth light emitting areas PXA1a, PXA2a, PXA3a, PXA4a, PXA1a-1, PXA2a-1, PXA3a-1, and PXA4a-1 and each of the light receiving area FXa and FXa-1 may have the lozenge shape or the rectangular shape when viewed in a plan view. As shown in FIG. 4C each of first to fourth light emitting areas PXA1b, PXA2b, PXA3b, PXA4b, PXA1b-1, PXA2b-1, PXA3b-1, and PXA4b-1 and each of the light receiving area FXb and FXb-1 may have the lozenge shape or the rectangular shape when viewed in a plan view. Different from the shapes shown in FIG. 4B, at least one of the light emitting areas and the light receiving area may have a shape different from that of the others.

The display element layer EDL included in the display module DM may include first, second, third, and fourth light emitting elements ED-1, ED-2, ED-3, and ED-4 disposed to correspond to the first to fourth light emitting areas PXA1, PXA2, PXA3, and PXA4 and the first to fourth light emitting areas PXA1-1, PXA2-1, PXA3-1, and PXA4-1 and the light receiving element OPD disposed to correspond to each of the light receiving areas FX and FX-1. The first light emitting element ED-1 may emit the first light, the second light emitting element ED-2 may emit the second light, and the third light emitting element ED-3 and the fourth light emitting element ED-4 may emit the third light. The light receiving element OPD may sense the light reflected by the external object and incident thereinto. The first light may be a red light, the second light may be a blue light, and the third light may be a green light, however, according to an embodiment, the first light may be the blue light, the second light may be the red light, and the third light may be the green light.

The first, second, third, and fourth light emitting elements ED-1, ED-2, ED-3, and ED-4 may include light emitting electrodes AE-1, AE-2, AE-3, and AE-4, respectively, a hole transport region HTR, light emitting layers EML-1, EML-2, EML-3, and EML-4, respectively, an electron transport region ETR, and a second electrode CE, which may be sequentially stacked on each other. The light receiving element OPD may include a light receiving electrode AE, the hole transport region HTR, a light receiving layer OPL, the electron transport region ETR, and the second electrode CE, which may be sequentially stacked on each other.

First electrodes AE-1, AE-2, AE-3, AE-4, and AE may be patterned to respectively correspond to the first, second, third, and fourth light emitting elements ED-1, ED-2, ED-3, and ED-4 and the light receiving element OPD. A first electrode EL1 of the light emitting elements ED-1, ED-2, ED-3, and ED-4 may be a light emitting electrode. A first electrode EL1 of the light receiving element OPD may be the light receiving electrode. The first electrode EL1 may have a conductivity. The first electrode EL1 may be formed of a metal material, a metal alloy, or a conductive compound. The first electrode EL1 may be an anode or a cathode, however, the disclosure should not be limited thereto or thereby. The first electrode EL1 may be a pixel electrode. The first electrode EL1 may be a reflective electrode. The first electrode EL1 may include Ag, Mg, Cu, Al, Pt, Pd, Au, Ni, Nd, Ir, Cr, $L_1$, Ca, LiF/Ca (a stack structure of LiF and Ca), LiF/Al (a stack structure of LiF and Al), Mo, Ti, W, a compound thereof, or a mixture thereof, e.g., a mixture of Ag and Mg.

According to an embodiment, the first electrode EL1 may have a multi-layer structure of a reflective or transreflective layer formed of the above materials and a transparent conductive layer formed of indium tin oxide (ITO), indium zinc oxide (IZO), zinc oxide (ZnO), indium tin zinc oxide (ITZO), or the like, or a combination thereof. As an example, the first electrode EL1 may have a three-layer structure of ITO/Ag/ITO, however, embodiments should not be limited thereto or thereby. According to an embodiment, the first electrode EL1 may include the metal materials, a combination of two or more of the metal materials, or an oxide of the metal materials. The first electrode EL1 may have a thickness from about 700 Å to about 10000 Å. As an example, the thickness of the first electrode EL1 may be within a range from about 1000 Å to about 3000 Å.

The hole transport region HTR may be provided as a common layer to overlap the first, second, third, and fourth light emitting elements ED-1, ED-2, ED-3, and ED-4 and the light receiving element OPD. The electron transport region ETR may be provided as a common layer to overlap the first, second, third, and fourth light emitting elements ED-1, ED-2, ED-3, and ED-4 and the light receiving element OPD. The second electrode CE may be provided as a single layer to overlap the first, second, third, and fourth light emitting elements ED-1, ED-2, ED-3, and ED-4 and the light receiving element OPD, however, this is merely an example. Although not shown in figures, at least one of the hole transport region HTR, the electron transport region ETR, and the second electrode CE of the display module DM may be patterned to correspond to each of the first, second, third, and fourth light emitting elements ED-1, ED-2, ED-3, and ED-4 and the light receiving element OPD.

The hole transport region HTR may have a single-layer structure of a single material, a single-layer structure of multiple different materials, or a multi-layer structure of layers formed of multiple different materials.

As an example, the hole transport region HTR may have a single-layer structure of a hole injection layer (not shown) or a hole transport layer (not shown) or may have a single-layer structure of a hole injection material and a hole transport material. The hole transport region HTR may have the single-layer structure of multiple different materials or may have a structure of the hole injection layer (not shown)/ the hole transport layer (not shown), the hole injection layer (not shown)/the hole transport layer (not shown)/a buffer layer (not shown), the hole injection layer (not shown)/the buffer layer (not shown), the hole transport layer (not shown)/the buffer layer (not shown), or the hole injection layer (not shown)/the hole transport layer (not shown)/an electron blocking layer (not shown), each of which may be sequentially stacked on each other on the first electrode EL1, however, the disclosure should not be limited thereto or thereby.

The electron transport region ETR may have a single-layer structure of a single material, a single-layer structure of multiple different materials, or a multi-layer structure of layers formed of multiple different materials.

As an example, the electron transport region ETR may have a single-layer structure of an electron injection layer (not shown) or an electron transport layer (not shown) or may have a single-layer structure of an electron injection material and an electron transport material. The electron transport region ETR may have the single-layer structure of multiple different materials or may have a structure of the electron transport layer (not shown)/the electron injection layer (not shown) or a hole blocking layer (not shown)/the electron transport layer (not shown)/electron injection layer (not shown), each of which may be sequentially stacked on each other on the light emitting layer EML, however, the disclosure should not be limited thereto or thereby. The electron transport region ETR may have a thickness from about 1000 Å to about 1500 Å.

According to an embodiment, the electron transport region ETR may be formed by various methods, such as a vacuum deposition method, a spin coating method, a cast method, an LB (Langmuir-Blodgett) method, an inkjet printing method, a laser printing method, an LITI (Laser Induced Thermal Imaging) method, etc.

A second electrode CE may be disposed on the electron transport region ETR. The second electrode CE may be a common electrode. The second electrode CE may be a cathode or an anode, however, the disclosure should not be limited thereto or thereby. As an example, in case that the first electrode EL1 is the anode, the second electrode CE may be the cathode, and in case that the first electrode EL1 is the cathode, the second electrode CE may be the anode. The second electrode may include at least one selected from, compounds of two or more selected from, mixtures of two or more selected from, or an oxide of Ag, Mg, Cu, Al, Pt, Pd, Au, Ni, Nd, Ir, Cr, $L_1$, Ca, LiF, Mo, Ti, W, In, Sn, and Zn.

The second electrode CE may be a transflective electrode. The second electrode CE may include Ag, Mg, Cu, Al, Pt, Pd, Au, Ni, Nd, Ir, Cr, $L_1$, Ca, LiF/Ca, LiF/Al, Mo, Ti, Yb, W, a compound thereof, or a mixture thereof, e.g., AgMg, AgYb, or MgYb. According to an embodiment, the second electrode CE may have a multi-layer structure of a reflective or transflective layer formed of the above materials and a transparent conductive layer formed of indium tin oxide (ITO), indium zinc oxide (IZO), zinc oxide (ZnO), indium tin zinc oxide (ITZO), or the like, or a combination thereof. As an example, the second electrode CE may include the metal materials, a combination of two or more of the metal materials, or an oxide of the metal materials.

The first light emitting element ED-1 may further include a first resonance auxiliary layer OL-1 disposed between a first light emitting layer EML-1 and the hole transport region HTR. The third light emitting element ED-3 may further include a first sub-resonance auxiliary layer SOL-1 disposed between a third light emitting layer EML-3 and the hole transport region HTR. The fourth light emitting element ED-4 may further include a third sub-resonance auxiliary layer SOL-3 between a fourth light emitting layer EML-4 and the hole transport region HTR. The light receiving element OPD may further include a second sub-resonance auxiliary layer SOL-2 disposed between the light receiving layer OPL and the hole transport region HTR.

The first, second, and third sub-resonance auxiliary layers SOL-1, SOL-2, and SOL-3 may be provided as one layer. The first, second, and third sub-resonance auxiliary layers SOL-1, SOL-2, and SOL-3 may be formed through the same process using the same material. As the first, second, and third sub-resonance auxiliary layers SOL-1, SOL-2, and SOL-3 may be formed through the same process using the same material, the number of masks used in the manufacturing process of the display module DM may be reduced, and the manufacturing process may be simplified.

The first, second, third, and fourth light emitting elements ED-1, ED-2, ED-3, and ED-4 and the light receiving element OPD may further include a capping layer CPL disposed on the second electrode CE. The capping layer CPL may be provided as a single layer to entirely correspond to the first, second, third, and fourth light emitting elements ED-1, ED-2, ED-3, and ED-4 and the light receiving element OPD, however, this is merely one example. According to an embodiment, the capping layer CPL may be patterned to respectively correspond to the first, second, third, and fourth light emitting elements ED-1, ED-2, ED-3, and ED-4 and the light receiving element OPD.

Figure 6:
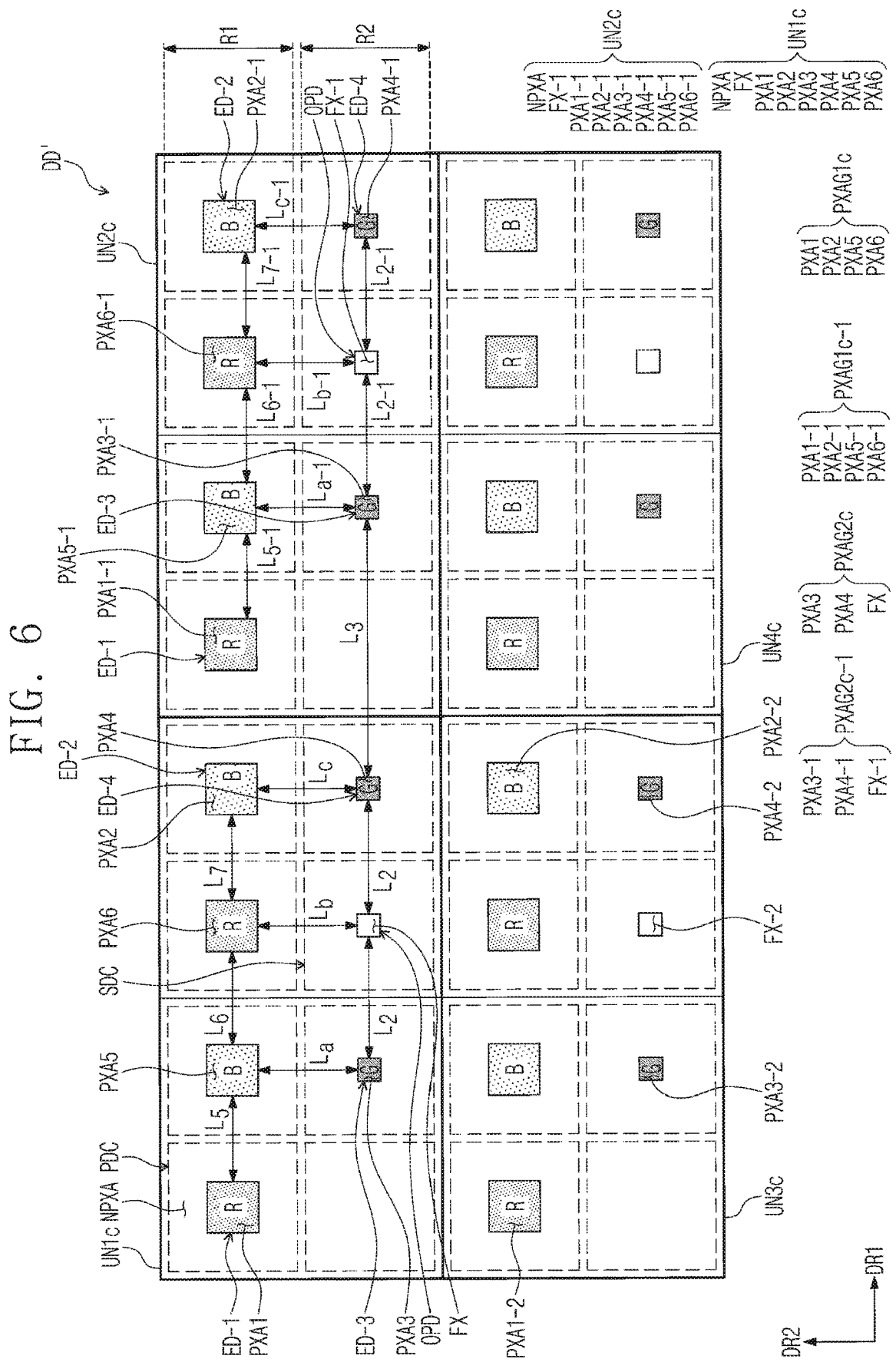
FIG. 6 is a schematic plan view of a portion of a display module according to an embodiment of the disclosure.
Figure 7:
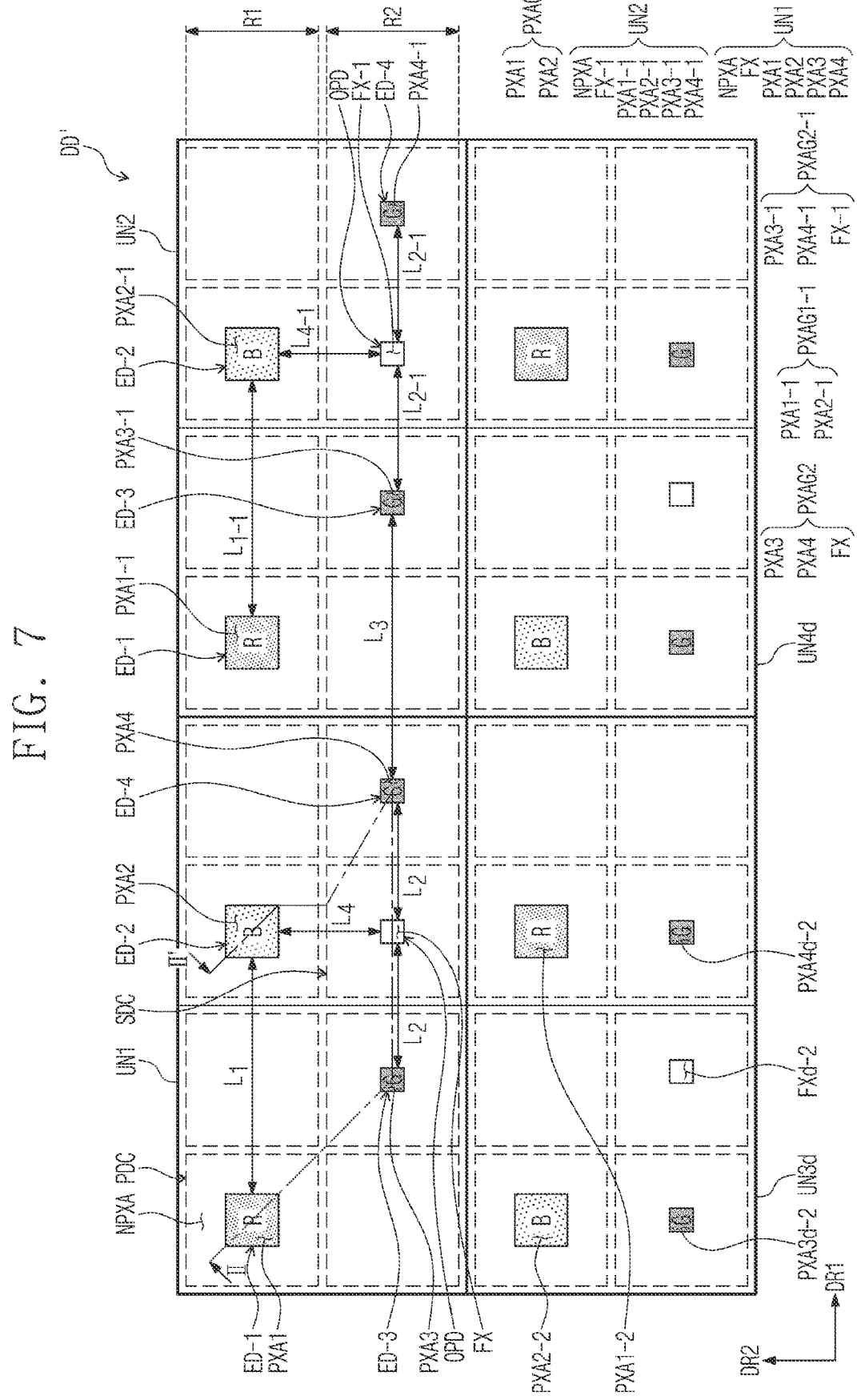
FIG. 7 is a schematic plan view of a portion of a display module according to an embodiment of the disclosure.
Figure 8:
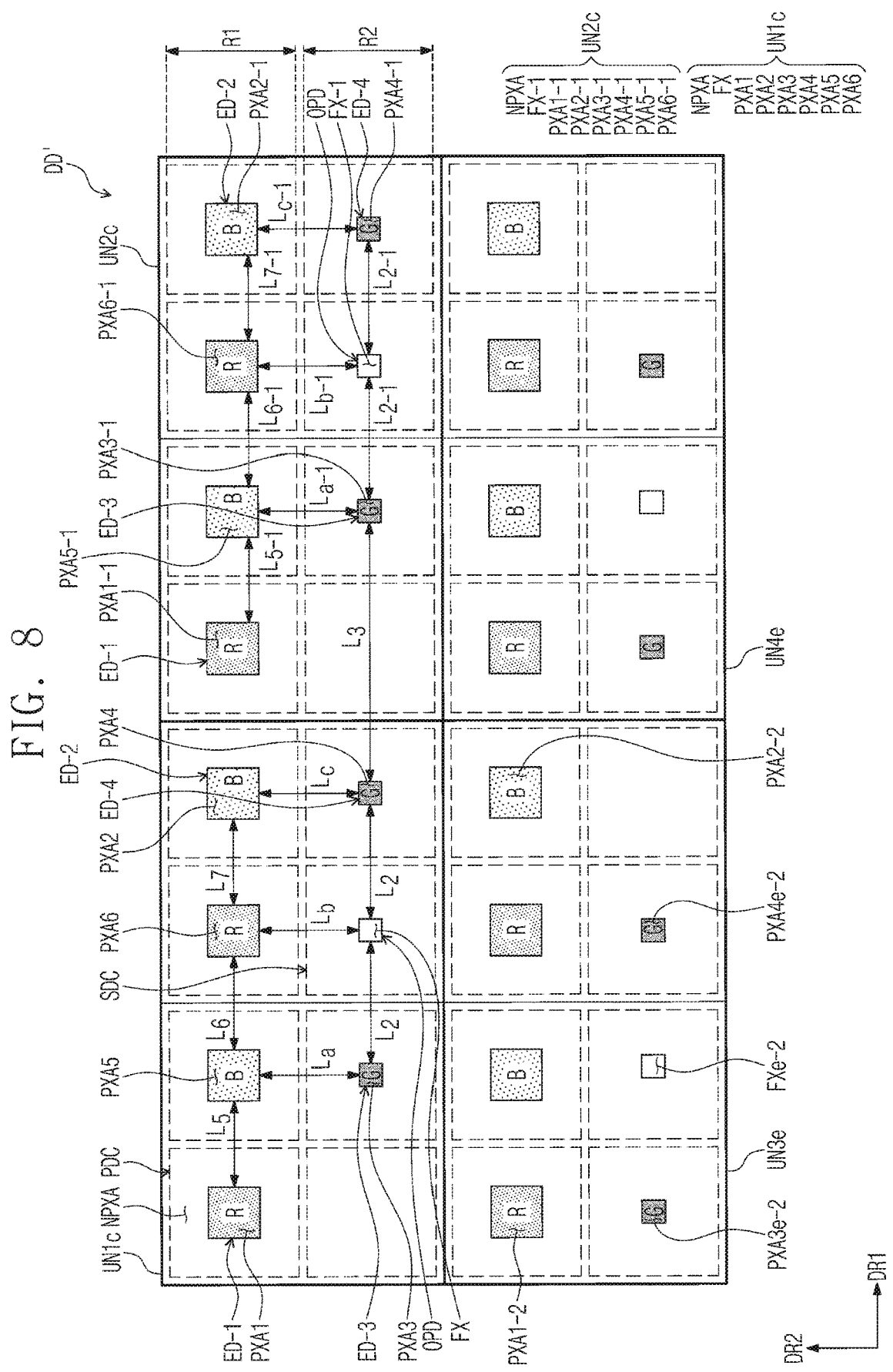
FIG. 8 is a schematic plan view of a portion of a display module according to an embodiment of the disclosure.

FIG. 6 is a schematic plan view of a portion of a display module according to an embodiment of the disclosure. FIG. 7 is a schematic plan view of a portion of a display module according to an embodiment of the disclosure. FIG. 8 is a schematic plan view of a portion of a display module according to an embodiment of the disclosure. Hereinafter, the display modules will be described in detail with reference to FIGS. 6 to 8.

Different from the display module shown in FIG. 4A, the display module shown in FIG. 6 may further include fifth light emitting areas PXA5 and PXA5-1 and sixth light emitting areas PXA6 and PXA6-1.

Referring to FIG. 6, a first unit pixel UN1c may further include the fifth light emitting area PXA5 disposed between a first light emitting area PXA1 and a second light emitting area PXA2 and the sixth light emitting area PXA6 disposed between the fifth light emitting area PXA5 and the second light emitting area PXA2. For example, a first group PXAG1c disposed in a first row R1 may include a first light emitting area PXA1, a second light emitting area PXA2, a fifth light emitting area PXA5, and a sixth light emitting area PXA6. A second group PXAG2c disposed in a second row R2 may include a third light emitting area PXA3, a fourth light emitting area PXA4, and a light receiving area FX.

A second unit pixel UN2c may further include the fifth light emitting area PXA5-1 disposed between a first light emitting area PXA1-1 and a second light emitting area PXA2-1 and the sixth light emitting area PXA6-1 disposed between the fifth light emitting area PXA5-1 and the second light emitting area PXA2-1. For example, a first group PXAG1c-1 disposed in the first row R1 may include the first light emitting area PXA1-1, the second light emitting area PXA2-1, the fifth light emitting area PXA5-1, and the sixth light emitting area PXA6-1. A second group PXAG2c-1 disposed in the second row R2 may include a third light emitting area PXA3-1, a fourth light emitting area PXA4-1, and a light receiving area FX-1.

In the first unit pixel UN1c, the first light emitting area PXA1 and the fifth light emitting area PXA5 may be spaced apart from each other by a fifth distance $L_5$ in the first direction DR1. The fifth light emitting area PXA5 and the sixth light emitting area PXA6 may be spaced apart from each other by a sixth distance $L_6$ in the first direction DR1. The sixth light emitting area PXA6 and the second light emitting area PXA2 may be spaced apart from each other by a seventh distance $L_7$ in the first direction DR1.

Each of the fifth distance $L_5$ to the seventh distance $L_7$ may be independently equal to or greater than about 10 μm and equal to and smaller than about 40 μm. As each of the fifth distance $L_5$ to the seventh distance $L_7$ may be adjusted to be equal to or greater than about 10 μm and equal to and smaller than about 40 μm, an area in which a mask used to form the first light emitting area PXA1, the fifth light emitting area PXA5, the sixth light emitting area PXA6, and the second light emitting area PXA2 is disposed may be secured, and the display device ED (refer to FIG. 1) with high resolution may be implemented. In case that each of the fifth distance $L_5$ to the seventh distance $L_7$ is independently smaller than about 10 μm, the area in which the mask used to form the first light emitting area PXA1, the fifth light emitting area PXA5, the sixth light emitting area PXA6, and the second light emitting area PXA2 is disposed may not be secured. In case that each of the fifth distance $L_5$ to the seventh distance $L_7$ is independently greater than about 40 μm, the resolution of the display device ED (refer to FIG. 1) may be deteriorated.

In the second unit pixel UN2c, the first light emitting area PXA1-1 and the fifth light emitting area PXA5-1 may be spaced apart from each other by a fifth distance $L_{5-1}$ in the first direction DR1. The fifth light emitting area PXA5-1 and the sixth light emitting area PXA6-1 may be spaced apart from each other by a sixth distance $L_{6-1}$ in the first direction DR1. The sixth light emitting area PXA6-1 and the second light emitting area PXA2-1 may be spaced apart from each other by a seventh distance $L_{7-1}$ in the first direction DR1.

Each of the fifth distance $L_{5-1}$ to the seventh distance $L_{7-1}$ may be independently equal to or greater than about 10 μm and equal to or smaller than about 40 μm. As each of the fifth distance $L_{5-1}$ to the seventh distance $L_{7-1}$ may be independently adjusted to be equal to or greater than about 10 μm and equal to or smaller than about 40 μm, an area in which a mask used to form the first light emitting area PXA1-1, the fifth light emitting area PXA5-1, the sixth light emitting area PXA6-1, and the second light emitting area PXA2-1 is disposed may be secured, and thus, the display device ED (refer to FIG. 1) with high resolution may be implemented. In case that each of the fifth distance $L_{5-1}$ to the seventh distance $L_{7-1}$ is independently smaller than about 10 μm, the area in which the mask used to form the first light emitting area PXA1-1, the fifth light emitting area PXA5-1, the sixth light emitting area PXA6-1, and the second light emitting area PXA2-1 is disposed may not be secured. In case that each of the fifth distance $L_{5-1}$ to the seventh distance $L_{7-1}$ is independently greater than about 40 μm, the resolution of the display device ED (refer to FIG. 1) may be deteriorated.

In the first unit pixel UN1c, the fifth light emitting area PXA5 may be disposed to overlap the third light emitting area PXA3 in the second direction DR2. The sixth light emitting area PXA6 may be disposed to overlap the light receiving area FX in the second direction DR2. The second light emitting area PXA2 may be disposed to overlap the fourth light emitting area PXA4 in the second direction DR2.

In the first unit pixel UN1c, each of a separation distance $L_a$ (a first vertical distance) in the second direction DR2 between the fifth light emitting area PXA5 and the third light emitting area PXA3, a separation distance $L_b$ (a second vertical distance) in the second direction DR2 between the sixth light emitting area PXA6 and the light receiving area FX, and a separation distance $L_c$ (a third vertical distance) in the second direction DR2 between the second light emitting area PXA2 and the fourth light emitting area PXA4 may be independently equal to or greater than about 10 μm and equal to or smaller than about 40 μm.

As the first vertical distance $L_a$, the second vertical distance $L_b$, and the third vertical distance $L_c$ may be adjusted to be equal to or greater than about 10 μm and equal to or smaller than about 40 μm, an area in which a mask used to form the fifth light emitting area PXA5, the third light emitting area PXA3, the sixth light emitting area PXA6, and the light receiving area FX is disposed may be secured, and thus, the display device ED (refer to FIG. 1) with high resolution and sensitivity may be implemented. In case that each of the first vertical distance $L_a$, the second vertical distance $L_b$, and the third vertical distance Le is independently smaller than about 10 μm, the area in which the mask used to form the fifth light emitting area PXA5, the third light emitting area PXA3, the sixth light emitting area PXA6, and the light receiving area FX is disposed may not be secured. In case that each of the first vertical distance $L_a$, the second vertical distance $L_b$, and the third vertical distance $L_c$ is independently greater than about 40 µm, the resolution and the sensitivity with respect to the external input of the display device ED (refer to FIG. 1) may be deteriorated.

In the second unit pixel UN2c, the fifth light emitting area PXA5-1 may be disposed to overlap the third light emitting area PXA3-1 in the second direction DR2. The sixth light emitting area PXA6-1 may be disposed to overlap the light receiving area FX-1 in the second direction DR2. The second light emitting area PXA2-1 may be disposed to overlap the fourth light emitting area PXA4-1 in the second direction DR2.

In the second unit pixel UN2c, each of a separation distance $L_{a-1}$ (a fourth vertical distance) in the second direction DR2 between the fifth light emitting area PXA5-1 and the third light emitting area PXA3-1, a separation distance $L_{b-1}$ (a fifth vertical distance) in the second direction DR2 between the sixth light emitting area PXA6-1 and the light receiving area FX-1, and a separation distance $L_{c-1}$ (a sixth vertical distance) in the second direction DR2 between the second light emitting area PXA2-1 and the fourth light emitting area PXA4-1 may be independently equal to or greater than about 10 µm and equal to or smaller than about 40 µm. As the fourth vertical distance $L_{a-1}$, the fifth vertical distance $L_{b-1}$, and the sixth vertical distance $L_{c-1}$ may be adjusted to be equal to or greater than about 10 µm and equal to or smaller than about 40 µm, an area in which a mask used to form the fifth light emitting area PXA5-1, the third light emitting area PXA3-1, the sixth light emitting area PXA6-1, and the light receiving area FX-1 is disposed may be secured, and thus, the display device ED (refer to FIG. 1) with high resolution and sensitivity may be implemented. In case that each of the fourth vertical distance $L_{a-1}$, the fifth vertical distance $L_{b-1}$, and the sixth vertical distance $L_{c-1}$ is independently smaller than about 10 µm, the area in which the mask used to form the fifth light emitting area PXA5-1, the third light emitting area PXA3-1, the sixth light emitting area PXA6-1, and the light receiving area FX-1 is disposed may not be secured. In case that each of the fourth vertical distance $L_{a-1}$, the fifth vertical distance $L_{b-1}$, and the sixth vertical distance $L_{c-1}$ is independently greater than about 40 µm, the resolution and the sensitivity with respect to the external input of the display device ED (refer to FIG. 1) may be deteriorated.

The display module may further include a third unit pixel UN3c spaced apart from the first unit pixel UN1c in the second direction DR2 when viewed in a plan view and a fourth unit pixel UN4c spaced apart from the second unit pixel UN2c in the second direction DR2. The light emitting areas and the light receiving area in each of the first to fourth unit pixels UN1c to UN4c may be arranged in the same pattern.

FIG. 7 is a schematic plan view of the portion of the display module according to an embodiment of the disclosure. Different from the display module described with reference to FIG. 4A, FIG. 7 shows a structure in which a third light emitting area, a light receiving area, and a fourth light emitting area of a first unit pixel may not correspond to a third light emitting area, a light receiving area, and a fourth light emitting area of a third unit pixel in the second direction DR2 and a third light emitting area, a light receiving area, and a fourth light emitting area of a second unit pixel may not correspond to a third light emitting area, a light receiving area, and a fourth light emitting area of a fourth unit pixel in the second direction.

Referring to FIG. 7, a first light emitting area PXA1 of the first unit pixel UN1 may overlap the third light emitting area PXA3d-2 of the third unit pixel UN3d in the second direction DR2. The third light emitting area PXA3 of the first unit pixel UN1 may overlap the light receiving area FXd-2 of the third unit pixel UN3d in the second direction DR2. The light receiving area FX of the first unit pixel UN1 may overlap the fourth light emitting area PXA4d-2 of the third unit pixel UN3d in the second direction DR2.

In an arrangement relationship of the light emitting areas and the light receiving area, an arrangement relationship between the second unit pixel UN2 and the fourth unit pixel UN4d may be substantially the same as the arrangement relationship between the first unit pixel UN1 and the third unit pixel UN3d.

FIG. 8 is a schematic plan view of the portion of the display module according to an embodiment of the disclosure. Different from the display module described with reference to FIG. 6, FIG. 8 shows a structure in which a third light emitting area, a light receiving area, and a fourth light emitting area of a first unit pixel may not correspond to a third light emitting area, a light receiving area, and a fourth light emitting area of a third unit pixel in the second direction DR2 and a third light emitting area, a light receiving area, and a fourth light emitting area of a second unit pixel may not correspond to a third light emitting area, a light receiving area, and a fourth light emitting area of a fourth unit pixel in the second direction.

Referring to FIG. 8, a first light emitting area PXA1 of the first unit pixel UN1c may overlap a third light emitting area PXA3e-2 of the third unit pixel UN3e in the second direction DR2. The third light emitting area the PXA3 of the first unit pixel UN1c may overlap the light receiving area FXe-2 of the third unit pixel UN3e in the second direction DR2. The light receiving area FX of the first unit pixel UN1c may overlap a fourth light emitting area PXA4e-2 of the third unit pixel UN3e in the second direction DR2.

In an arrangement relationship of the light emitting areas and the light receiving area, an arrangement relationship between the second unit pixel UN2c and the fourth unit pixel UN4e may be substantially the same as the arrangement relationship between the first unit pixel UN1c and the third unit pixel UN3e.

Hereinafter, a method of manufacturing a display device will be described with reference to FIGS. 9A to 11B. In detail, structural characteristics of the display device will not be described again, and descriptions will be focused on the characteristics of the manufacturing method.

Figure 9A:
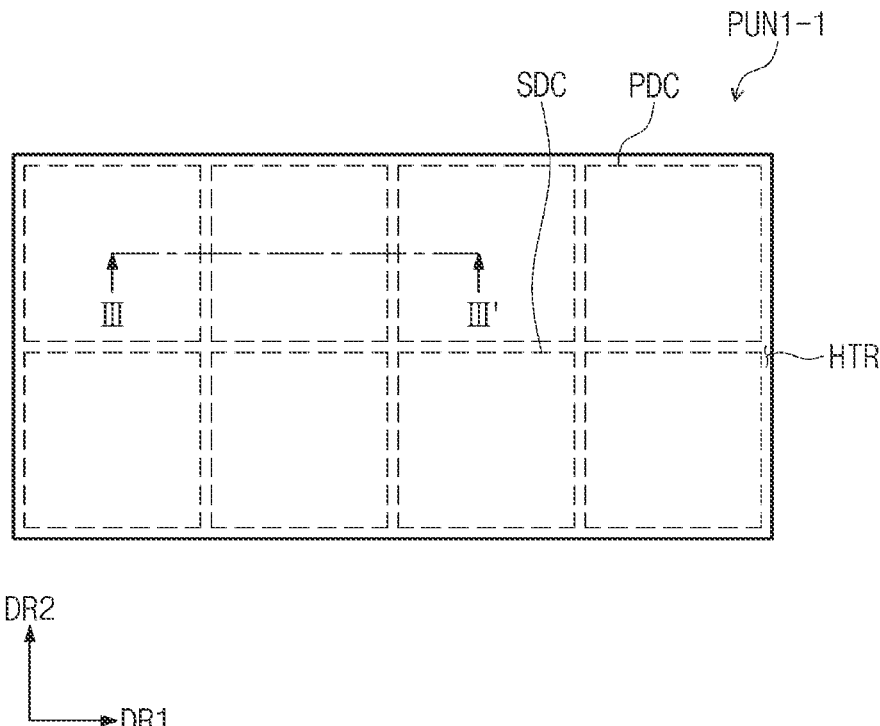
FIG. 9A is a schematic plan view of a portion of a preliminary unit pixel according to an embodiment of the disclosure.
Figure 9B:
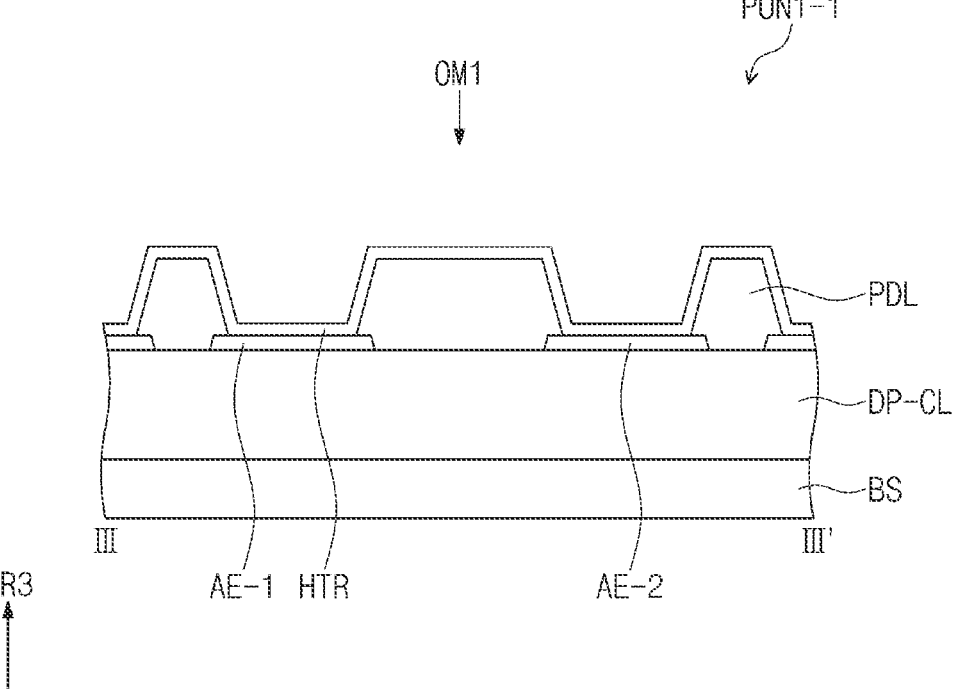
FIG. 9B is a schematic cross-sectional view of a portion of a preliminary unit pixel according to an embodiment of the disclosure.
Figure 10A:
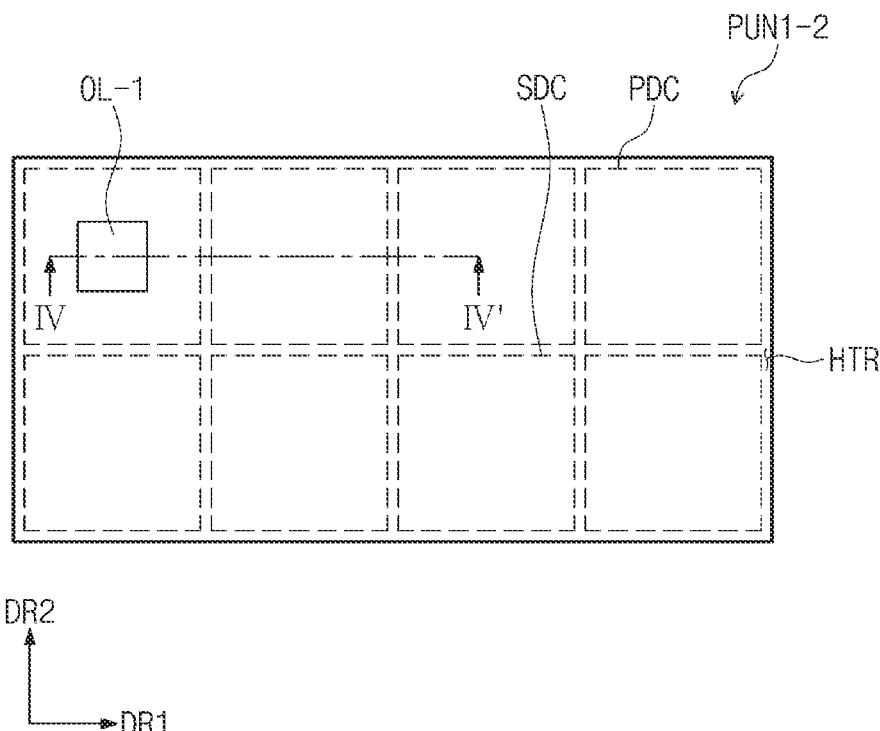
FIG. 10A is a schematic plan view of a portion of a preliminary unit pixel according to an embodiment of the disclosure.
Figure 10B:
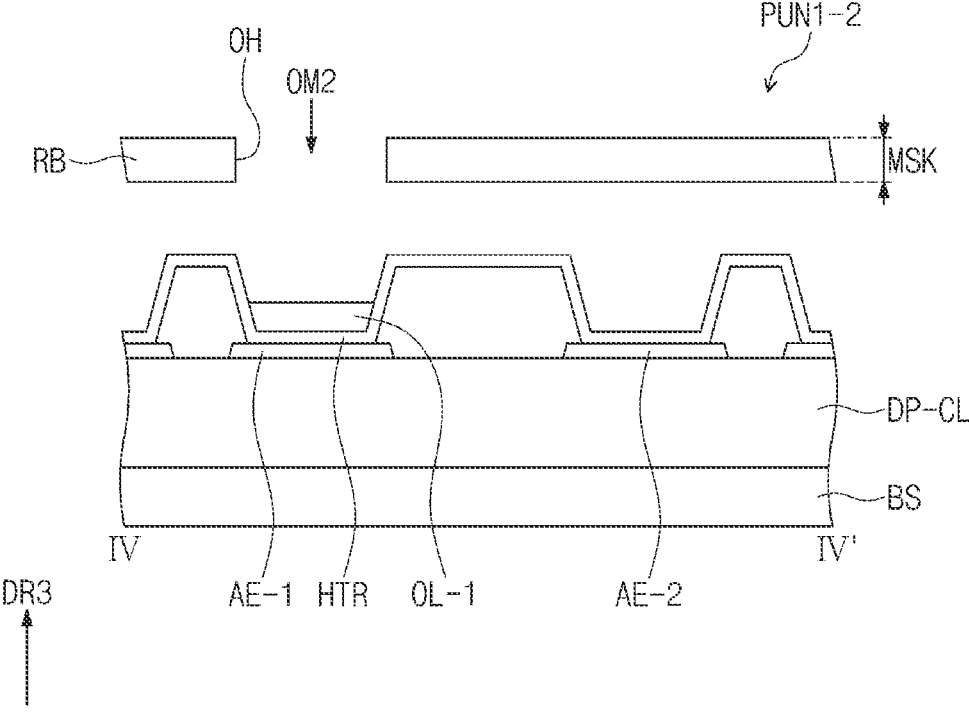
FIG. 10B is a schematic cross-sectional view of a portion of a preliminary unit pixel according to an embodiment of the disclosure.
Figure 11A:
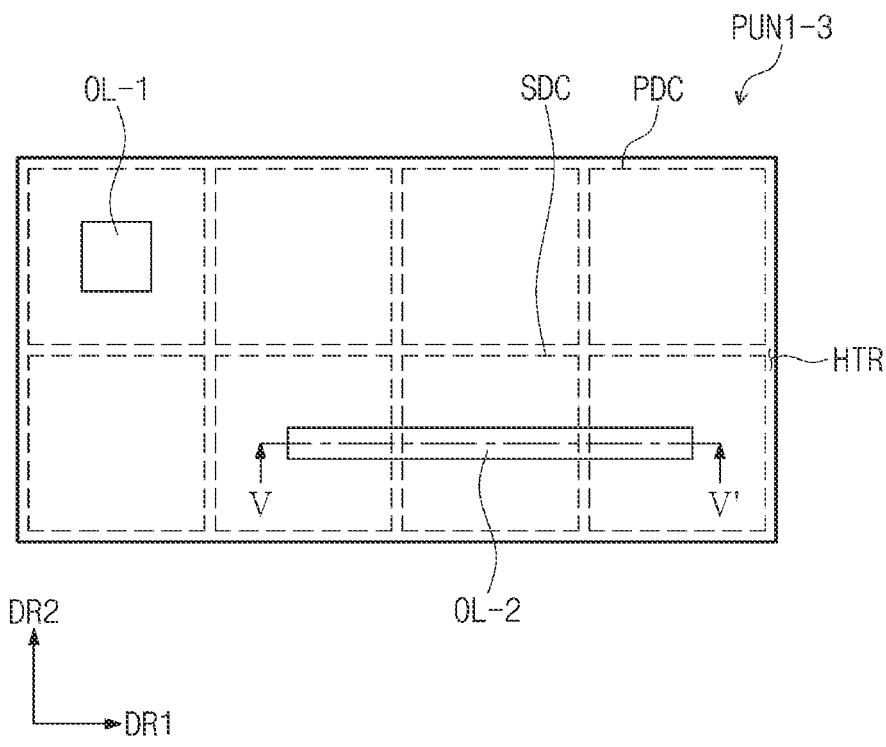
FIG. 11A is a schematic plan view of a portion of a preliminary unit pixel according to an embodiment of the disclosure.
Figure 11B:
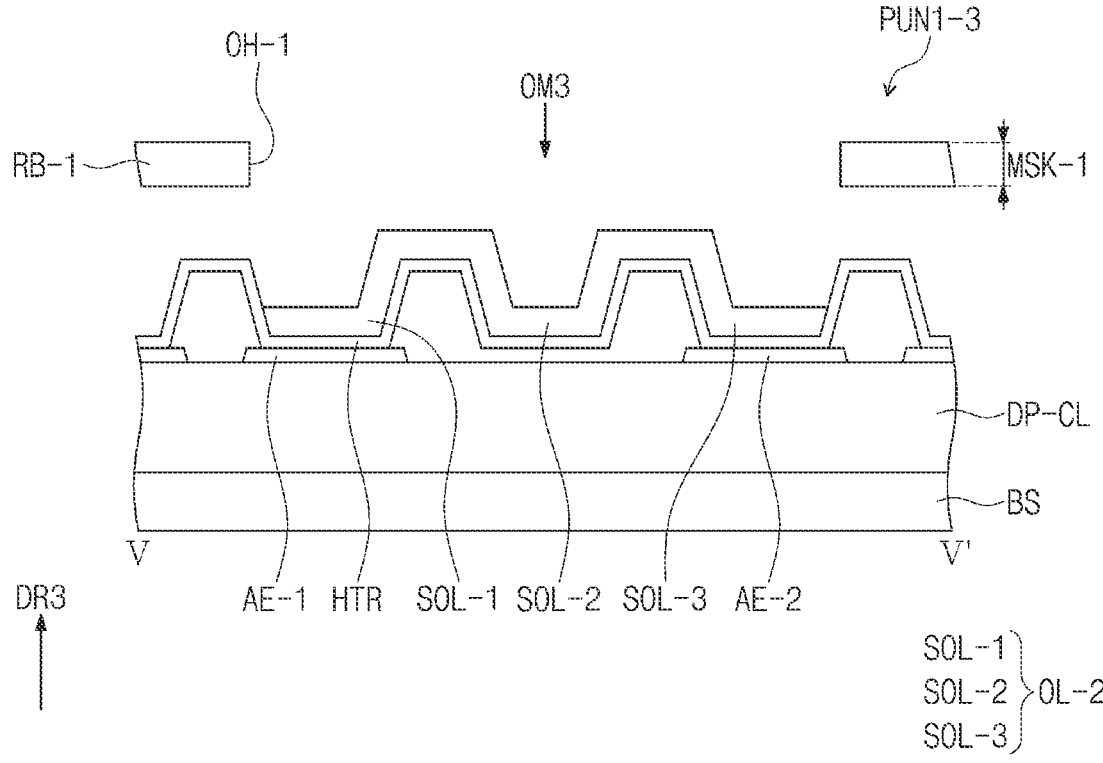
FIG. 11B is a schematic cross-sectional view of a portion of a preliminary unit pixel according to an embodiment of the disclosure.

FIGS. 9A, 10A, and 11A are schematic plan views of a portion of a preliminary unit pixel. FIGS. 9B, 10B, and 11B are schematic cross-sectional views of the portion of the preliminary unit pixel. FIG. 9B is a cross-sectional view of the preliminary unit pixel taken along a line III-III' of FIG. 9A. FIG. 10B is a cross-sectional view of the preliminary unit pixel taken along a line IV-IV' of FIG. 10A. FIG. 11B is a cross-sectional view of the preliminary unit pixel taken along a line V-V' of FIG. 11A.

FIGS. 9A and 9B show a process of providing a first organic material OM1 onto the pixel definition layer PDL and the first electrodes AE-1 and AE-2 exposed without being covered by the pixel definition layer PDL to form the hole transport region HTR among manufacturing processes of the display device. According to the manufacturing method of the display device, the hole transport region HTR may be provided as a single layer. As a result, a first preliminary unit pixel PUN1-1 in which the hole transport region HTR is entirely provided may be provided.

FIGS. 10A and 10B show a process of partially providing a second organic material OM2 onto the hole transport region HTR to form the first resonance auxiliary layer OL-1 among the manufacturing processes of the display device. The first resonance auxiliary layer OL-1 may be provided in the first light emitting area PXA1 (refer to FIG. 4A) from which the first light may be emitted. As a result, a second preliminary unit pixel PUN1-2 in which the first resonance auxiliary layer OL-1 is partially provided may be provided.

The process of forming the first resonance auxiliary layer OL-1 may be performed using a first mask MSK. The first mask MSK may be, but is not limited to, a fine metal mask (FMM). The first mask MSK may include a first rib RB through which a first opening OH may be defined. A width in the first direction DR1 of the first opening OH may correspond to a width of the first light emitting area PXA1 (refer to FIG. 4A). In case that the first distance $L_1$ (refer to FIG. 4A) described with reference to FIG. 4A is about 10 μm or more, an area in which the first rib RB is disposed may be secured.

FIGS. 11A and 11B show a process of partially providing a third organic material OM3 onto the hole transport region HTR to form the second resonance auxiliary layer OL-2 among the manufacturing processes of the display device. The process of forming the second resonance auxiliary layer OL-2 may include providing the third organic material OM3 on a portion corresponding to the third light emitting area PXA3 (refer to FIG. 4A), the fourth light emitting area PXA4 (refer to FIG. 4A), and the light receiving area FX (refer to FIG. 4A) as a single layer. As a result, a third preliminary unit pixel PUN1-3 in which the second resonance auxiliary layer OL-2 is partially provided may be provided.

The process of forming the second resonance auxiliary layer OL-2 may be performed using a second mask MSK-1. The second mask MSK-1 may be a fine metal mask (FMM). The second mask MSK-1 may include a second rib RB-1 through which a second opening OH-1 may be defined. A width in the first direction DR1 of the second opening OH-1 may correspond to a width from an end of the third light emitting area PXA3 (refer to FIG. 4A) to an end of the fourth light emitting area PXA4 in the first direction DR1. In case that the third distance $L_3$ (refer to FIG. 4A) described with reference to FIG. 4A is equal to or greater than about 25 μm, an area in which the second rib RB-1 is disposed may be secured. As the second resonance auxiliary layer OL-2 may be provided as a single common layer on the portion corresponding to the third light emitting area PXA3 (refer to FIG. 4A), the fourth light emitting area PXA4 (refer to FIG. 4A), and the light receiving area FX (refer to FIG. 4A) using one second mask MSK-1, the manufacturing process may be simplified.

According to the display device, the area required to form the rib of the mask that may be used to form the light emitting areas and the light receiving area and the area required to increase the aperture ratio may be secured by adjusting the distance between the light emitting areas and the light receiving area. In detail, in each unit pixel of the display device, a ratio of the number of green light emitting areas (e.g., the third light emitting area and the fourth light emitting area) to the number of the light receiving area may be 2:1, so the area for the increase of the aperture ratio and the area for the rib of the mask may be secured more readily when compared with a case that a ratio of the number of the green light emitting areas (e.g., the third light emitting area and the fourth light emitting area) to the number of the light receiving areas may be 1:1.

Accordingly, the resolution and the sensing sensitivity with respect to the external input of the display device may be improved. In the display device, the resonance auxiliary layer may be formed of one material through one process on the third light emitting area, the light receiving area, and the fourth light emitting area. Therefore, the number of masks used to manufacture the display device and the number of manufacturing processes of the display device may be reduced, and the efficiency of the manufacturing process of the display device may be improved.

Although the embodiments of the disclosure have been described, it is understood that the disclosure should not be limited to these embodiments but various changes and modifications can be made by one of ordinary skill in the art within the spirit and scope of the disclosure.

Therefore, the disclosed subject matter should not be limited to any single embodiment described herein.

What is claimed is:

1. A display device comprising:
a first unit pixel; and
a second unit pixel adjacent to the first unit pixel in a first direction, each of the first unit pixel and the second unit pixel comprising:
    a first group disposed in a first row; and
    a second group disposed in a second row spaced apart from the first row in a second direction perpendicular to the first direction,
wherein the first group comprises:
    a first light-emitting area emitting a red light; and
    a second light-emitting area spaced apart from the first light-emitting area by a first distance in the first direction and emitting a blue light, wherein the second group comprises:
    a light-receiving area;
    a third light-emitting area emitting a green light; and
    a fourth light-emitting area emitting the green light and spaced apart from the third light-emitting area in the first direction such that the light-receiving area is disposed between the third light-emitting area and the fourth light-emitting area,
wherein the third light-emitting area and the fourth light-emitting area are each spaced apart from the light-receiving area by a second distance in the same second group,
wherein the fourth light-emitting area of the first unit pixel and the third light-emitting area of the second unit pixel are spaced apart from each other by a third distance equal to or greater than about 25 micrometers and equal to or smaller than about 100 micrometers in the first direction, and
wherein, in each of the first unit pixel and the second unit pixel, a number of the light-receiving areas is half of a sum of a number of the third light-emitting areas and a number of the fourth light-emitting areas.

2. The display device of claim 1, further comprising:
a base layer;
a display element layer disposed on the base layer; and
an input-sensing layer disposed on the display element layer, wherein
the display element layer comprises:
    first, second, third, and fourth light-emitting elements that are disposed to correspond to the first, second, third, and fourth light-emitting areas; and a light-receiving element disposed to correspond to the light-receiving area.

3. The display device of claim 2, wherein each of the first, second, third, and fourth light-emitting elements comprises a first light-emitting electrode, a hole transport region, a light-emitting layer, an electron transport region, and a second electrode, which are sequentially stacked on each other, the light-receiving element comprises a light-receiving electrode, the hole transport region, a light-receiving layer, the electron transport region, and the second electrode, which are sequentially stacked on each other, the first light-emitting element further comprises a first resonance auxiliary layer disposed between the light-emitting layer and the hole transport region, the third light-emitting element further comprises a first sub-resonance auxiliary layer disposed between the light-emitting layer and the hole transport region, the fourth light-emitting element further comprises a second sub-resonance auxiliary layer disposed between the light-emitting layer and the hole transport region, and the light-receiving element further comprises a third sub-resonance auxiliary layer disposed between the light-receiving layer and the hole transport region.

4. The display device of claim 3, wherein the first sub-resonance auxiliary layer, the second sub-resonance auxiliary layer, and the third sub-resonance auxiliary layer are a single continuous layer.

5. The display device of claim 1, wherein each of the first and second distances is equal to or greater than about 10 micrometers and equal to or smaller than about 40 micrometers.

6. The display device of claim 1, wherein the second light-emitting area and the light-receiving area overlap each other in the second direction, and a separation distance in the second direction between the second light-emitting area and the light-receiving area is equal to or greater than about 10 micrometers and equal to or smaller than about 40 micrometers.

7. The display device of claim 1, wherein each of the first unit pixel and the second unit pixel further comprises:

a fifth light-emitting area disposed between the first light-emitting area and the second light-emitting area to emit the blue light; and a sixth light-emitting area disposed between the fifth light-emitting area and the second light-emitting area to emit the red light.

8. The display device of claim 7, wherein the first light-emitting area and the fifth light-emitting area are spaced apart from each other by a fifth distance in the first direction, the fifth light-emitting area and the sixth light-emitting area are spaced apart from each other by a sixth distance in the first direction, the sixth light-emitting area and the second light-emitting area are spaced apart from each other by a seventh distance in the first direction, and each of the fifth, sixth, and seventh distances is equal to or greater than about 10 micrometers and equal to or smaller than about 40 micrometers.

9. The display device of claim 7, wherein the fifth light-emitting area overlaps the third light-emitting area in the second direction, the sixth light-emitting area overlaps the light-receiving area in the second direction, and the second light-emitting area overlaps the fourth light-emitting area in the second direction.

10. The display device of claim 9, wherein each of a separation distance between the fifth light-emitting area and the third light-emitting area in the second direction, a separation distance between the sixth light-emitting area and the light-receiving area in the second direction, and a separation distance between the second light-emitting area and the fourth light-emitting area in the second direction is equal to or greater than about 10 micrometers and equal to or smaller than about 40 micrometers.

11. The display device of claim 1, wherein each of the first, second, third, and fourth light-emitting areas and the light-receiving area have at least one of a lozenge shape, a square shape, and a rectangular shape when viewed in a plan view.

12. The display device of claim 1, wherein each of the first unit pixel and the second unit pixel comprises:

two light-emitting areas disposed in the second row; and one light-receiving area disposed in the second row.

13. The display device of claim 1, further comprising a third unit pixel disposed adjacent to the first unit pixel in the second direction, wherein the third unit pixel comprises:

a second-second light-emitting area overlapping the first light-emitting area of the first unit pixel in the second direction and emitting the blue light;

a first-second light-emitting area spaced apart from the second-second light emitting area in the first direction, overlapping the second light-emitting area of the first unit pixel in the second direction, and emitting the red light;

a third-second light-emitting area overlapping the second-second light-emitting area in the second direction and emitting the green light;

a fourth-second light-emitting area spaced apart from the third-second light-emitting area in the first direction, overlapping the light-receiving area of the first unit pixel in the second direction, and emitting the green light; and a second light-receiving area disposed between the third-second light-emitting area and the fourth-second light-emitting area.

14. A display device comprising:

a first unit pixel;

a second unit pixel adjacent to the first unit pixel in a first direction;

a base layer;

a display element layer disposed on the base layer and comprising a pixel definition layer through which an opening is defined, first, second, third, and fourth light-emitting elements that are distinguished from each other by the pixel definition layer, and a light-receiving element; and an input-sensing layer disposed on the display element layer, wherein each of the first, second, third, and fourth light-emitting elements and the light-receiving element comprise a first electrode, a hole transport region, an electron transport region, and a second electrode, which are sequentially stacked on each other, the first light-emitting element further comprises a first resonance auxiliary layer disposed between the hole transport region and the electron transport region and a first layer disposed between the first resonance auxiliary layer and the electron transport region and emitting a first light, the second light-emitting element further comprises a second light-emitting layer disposed between the hole transport region and the electron transport region and emitting a second light, the third light-emitting element further comprises a first sub-resonance auxiliary layer disposed between the hole transport region and the electron transport region and a third light-emitting layer disposed between the first sub-resonance auxiliary layer and the electron transport region and emitting a third light, the fourth light-emitting element further comprises a second sub-resonance auxiliary layer disposed between the hole transport region and the electron transport region and a fourth light-emitting layer disposed between the second sub-resonance auxiliary layer and the electron transport region and emitting the third light, the light-receiving element further comprises a third sub-resonance auxiliary layer disposed between the hole transport region and the electron transport region and a light-receiving layer disposed between the first sub-resonance auxiliary layer and the electron transport region, and the first sub-resonance auxiliary layer, the second sub-resonance auxiliary layer, and the third sub-resonance auxiliary layer are a single connected layer having no disconnected portions.

15. The display device of claim 14, wherein, when viewed in a plan view, each of the first unit pixel and the second unit pixel comprises:

a first group disposed in a first row; and a second group disposed in a second row spaced apart from the first row in a second direction perpendicular to the first direction, the first group comprises:

a first light-emitting area corresponding to the first light-emitting element; and a second light-emitting area spaced apart from the first light-emitting area by a first distance in the first direction and corresponding to the second light-emitting element, and the second group comprises:

a light-receiving area corresponding to the light-receiving element;

a third light-emitting area corresponding to the third light-emitting element; and a fourth light-emitting area corresponding to the fourth light-emitting element and spaced apart from the third light-emitting area in the first direction such that the light-receiving area is disposed between the third light-emitting area and the fourth light-emitting area, and wherein the third light-emitting area and the fourth light-emitting area are each spaced apart from the light-receiving area by a second distance in the same second group.

16. The display device of claim 15, wherein the fourth light-emitting area of the first unit pixel is spaced apart from the third light-emitting area of the second unit pixel by a third distance in the first direction, and the third distance is greater than each of the first and second distances.

17. The display device of claim 16, wherein the third distance is equal to or greater than about 25 micrometers and equal to or smaller than about 100 micrometers.

18. The display device of claim 15, wherein a separation distance in the second direction between the second light-emitting area and the light-receiving area is equal to or greater than about 10 micrometers and equal to or smaller than about 40 micrometers.

19. The display device of claim 15, wherein each of the first unit pixel and the second unit pixel further comprises:

a fifth light-emitting area disposed between the first light-emitting area and the second light-emitting area and emitting the second light; and a sixth light-emitting area disposed between the fifth light-emitting area and the second light-emitting area and emitting the first light.

20. The display device of claim 19, wherein the first light-emitting area and the fifth light-emitting area are spaced apart from each other by a fifth distance in the first direction, the fifth light-emitting area and the sixth light-emitting area are spaced apart from each other by a sixth distance in the first direction, the sixth light-emitting area and the second light-emitting area are spaced apart from each other by a seventh distance in the first direction, and each of the fifth, sixth, and seventh distances is equal to or greater than about 10 micrometers and equal to or smaller than about 40 micrometers.

* * * * *